US011658459B2

(12) United States Patent
Hemenway et al.

(10) Patent No.: US 11,658,459 B2
(45) Date of Patent: *May 23, 2023

(54) TECHNIQUES FOR LASER ALIGNMENT IN PHOTONIC INTEGRATED CIRCUITS

(71) Applicant: MACOM Technology Solutions Holdings, Inc., Lowell, MA (US)

(72) Inventors: Roe Hemenway, Painted Post, NY (US); Cristian Stagarescu, Ithaca, NY (US); Daniel Meerovich, Somerset, NJ (US); Malcolm R. Green, Lansing, NY (US); Wolfgang Parz, Ithaca, NY (US); Jichi Ma, Ithaca, NY (US); Richard Robert Grzybowski, Corning, NY (US); Nathan Bickel, Ithaca, NY (US)

(73) Assignee: MACOM Technology Solutions Holdings, Inc., Lowell, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/036,454

(22) Filed: Jul. 16, 2018

(65) Prior Publication Data
US 2018/0342851 A1    Nov. 29, 2018

Related U.S. Application Data

(63) Continuation of application No. 15/436,474, filed on Feb. 17, 2017, now Pat. No. 10,027,087.
(Continued)

(51) Int. Cl.
*H01S 5/026* (2006.01)
*G02B 6/42* (2006.01)
(Continued)

(52) U.S. Cl.
CPC .............. *G02B 6/423* (2013.01); *G02B 6/42* (2013.01); *G02B 6/4232* (2013.01); *H01S 5/023* (2021.01);
(Continued)

(58) Field of Classification Search
CPC ............. H01S 5/02224; H01S 5/02268; H01S 5/02272; H01S 5/1082; H01S 5/1085;
(Continued)

(56) References Cited

U.S. PATENT DOCUMENTS

| 5,488,678 A * | 1/1996 | Taneya ..................... G02B 6/42 |
| | | 372/50.1 |
| 5,594,749 A | 1/1997 | Behfar-Rad et al. |

(Continued)

FOREIGN PATENT DOCUMENTS

| CN | 1910486 | 2/2007 |
| EP | 0462742 A2 | 12/1991 |

(Continued)

OTHER PUBLICATIONS

Extended European Search Report issued in EP 17753975.6, dated Feb. 28, 2019 (10 pages).
(Continued)

*Primary Examiner* — Tod T Van Roy
(74) *Attorney, Agent, or Firm* — Perilla Knox & Hildebrandt LLP; Jason M. Perilla

(57) ABSTRACT

Techniques for efficient alignment of a semiconductor laser in a Photonic Integrated Circuit (PIC) are disclosed. In some embodiments, a photonic integrated circuit (PIC) may include a semiconductor laser that includes a laser mating surface, and a substrate that includes a substrate mating surface. A shape of the laser mating surface and a shape of the substrate mating surface may be configured to align the semiconductor laser with the substrate in three dimensions.

33 Claims, 23 Drawing Sheets

Related U.S. Application Data

(60) Provisional application No. 62/297,735, filed on Feb. 19, 2016.

(51) Int. Cl.

| | |
|---|---|
| *H01S 5/023* | (2021.01) |
| *H01S 5/0233* | (2021.01) |
| *H01S 5/0235* | (2021.01) |
| *H01S 5/02326* | (2021.01) |
| *H01S 5/02345* | (2021.01) |
| *H01S 5/02375* | (2021.01) |
| *H01S 5/32* | (2006.01) |
| *H01S 5/10* | (2021.01) |
| *H01S 5/00* | (2006.01) |
| *H01S 5/0234* | (2021.01) |
| *H01S 5/0237* | (2021.01) |

(52) U.S. Cl.
CPC ............ *H01S 5/026* (2013.01); *H01S 5/0233* (2021.01); *H01S 5/0235* (2021.01); *H01S 5/02326* (2021.01); *H01S 5/02345* (2021.01); *H01S 5/02375* (2021.01); *G02B 6/4238* (2013.01); *H01S 5/005* (2013.01); *H01S 5/0234* (2021.01); *H01S 5/0237* (2021.01); *H01S 5/1082* (2013.01); *H01S 5/1085* (2013.01); *H01S 5/3211* (2013.01)

(58) Field of Classification Search
CPC ....... H01S 5/0234; H01S 5/0233–0239; H01S 5/1083; H01S 5/02326; G02B 6/423; G02B 6/4232; G02B 6/4238; G02B 6/4296

See application file for complete search history.

(56) References Cited

U.S. PATENT DOCUMENTS

| | | |
|---|---|---|
| 5,656,507 A | 8/1997 | Welbourn et al. |
| 5,675,684 A | 10/1997 | Hirataka et al. |
| 5,838,703 A | 11/1998 | Lebby et al. |
| 5,881,190 A | 3/1999 | Harpin et al. |
| 6,693,936 B2 | 2/2004 | Kitaoka et al. |
| 6,933,536 B2 | 8/2005 | Bowen et al. |
| 6,993,053 B2 | 1/2006 | Buda et al. |
| 7,522,648 B2 | 4/2009 | Park et al. |
| 8,168,939 B2 | 5/2012 | Mack et al. |
| 8,391,657 B2 * | 3/2013 | Asahi ..................... G02B 6/423 385/52 |
| 9,830,937 B1 * | 11/2017 | Hipwell, Jr. ......... G11B 5/4826 |
| 2002/0011958 A1 | 1/2002 | Ogawa et al. |
| 2003/0081902 A1 | 5/2003 | Blauvelt et al. |
| 2004/0028104 A1 | 2/2004 | Buda et al. |
| 2005/0072984 A1 * | 4/2005 | Kwak ................ H01S 5/02272 257/99 |

FOREIGN PATENT DOCUMENTS

| | | |
|---|---|---|
| GB | 2381082 A | 4/2003 |
| GB | 2381082 A | 4/2003 |
| JP | H03205889 A | 9/1991 |
| JP | H0560952 A | 3/1993 |
| JP | H0745811 A | 2/1995 |
| JP | H07503328 A | 4/1995 |
| JP | 2000510256 A | 8/2000 |
| WO | 0106285 A2 | 1/2001 |
| WO | 03034115 A2 | 4/2003 |

OTHER PUBLICATIONS

International Search Report and Written Opinon issued by the U.S. Patent and Trademark as International Searching Authority, issued in International Application PCT/US17/18481, dated Jun. 12, 2017 (17 pages).
1st Office Action for Chinese Patent Application 201780020561.X dated Aug. 9, 2019.
European Search Report for EP Patent Application 20163531 dated May 13, 2020.
E.E.L. Friedrich et al: "Hybrid integration of semiconductor lasers with Si-based single-mode ridge waveguides", Journal of Lightwave Technology, vol. 10, No. 3, Mar. 1992 (Mar. 1992), pp. 336-340, XP055552640, USA.
Office Action for Chinese Application No. 202010111899.X dated Sep. 6, 2022.
Examination Report for Canadian Application No. 3,014,585 dated Dec. 19, 2022.

* cited by examiner

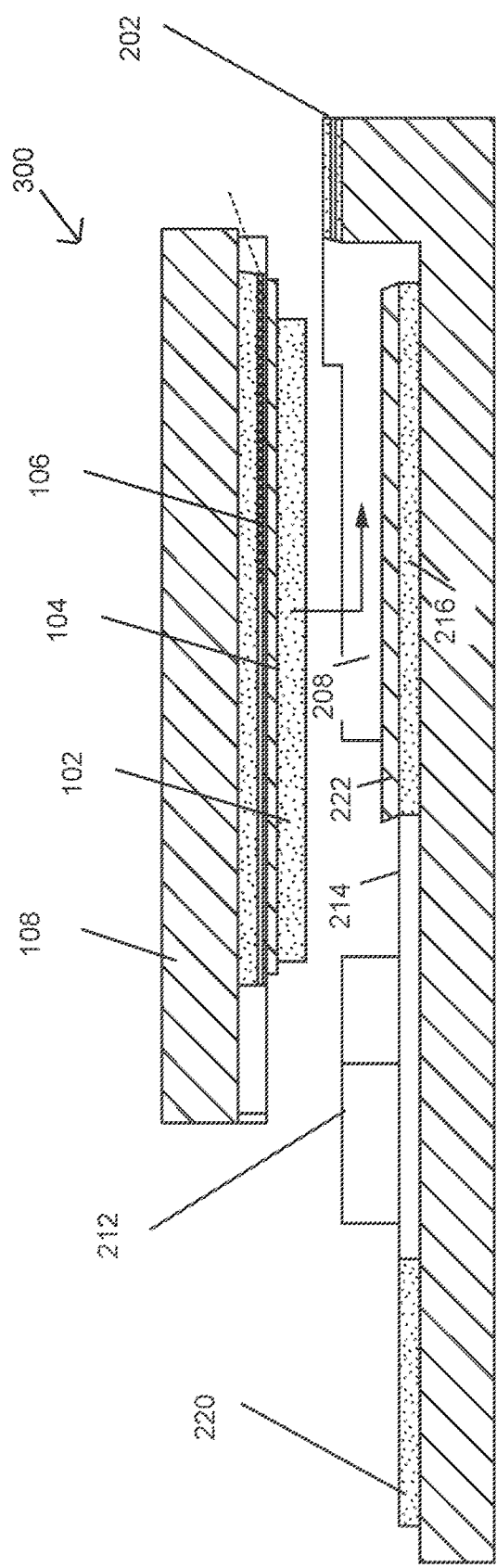
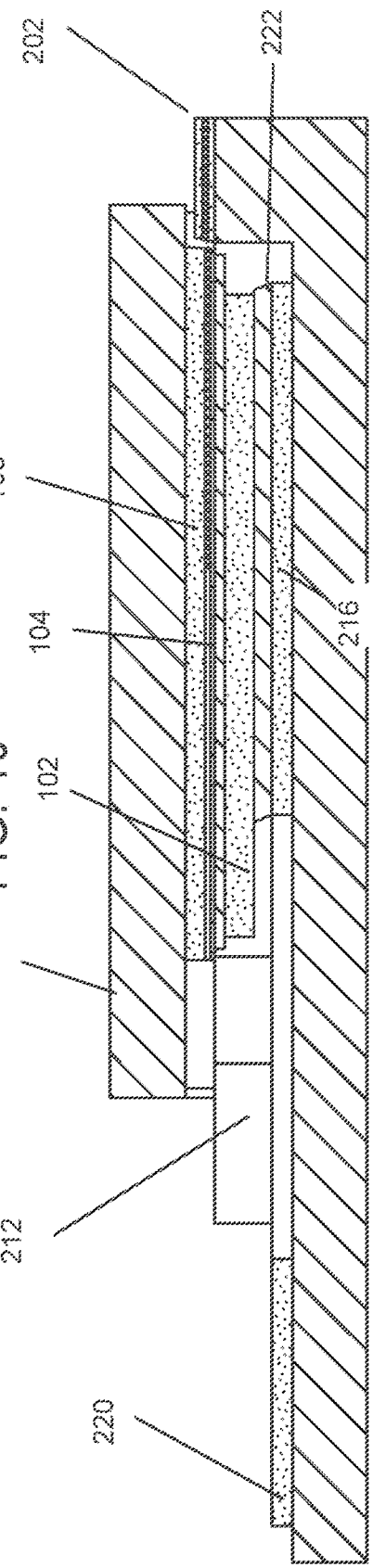
FIG. 10
FIG. 11

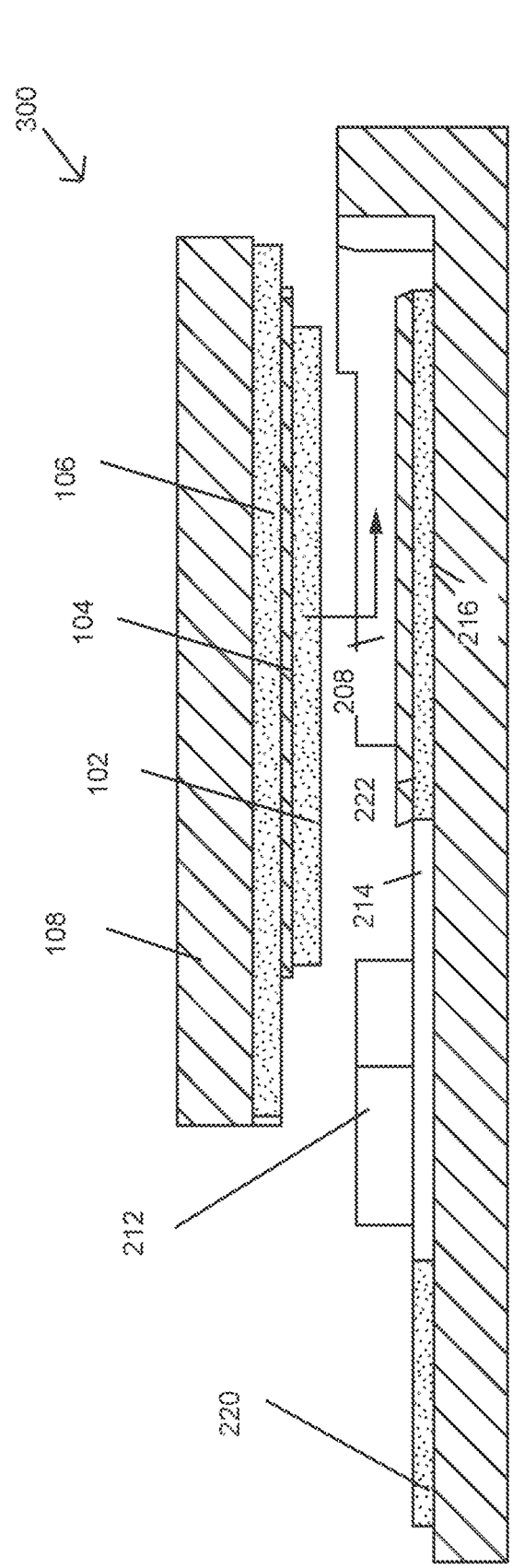
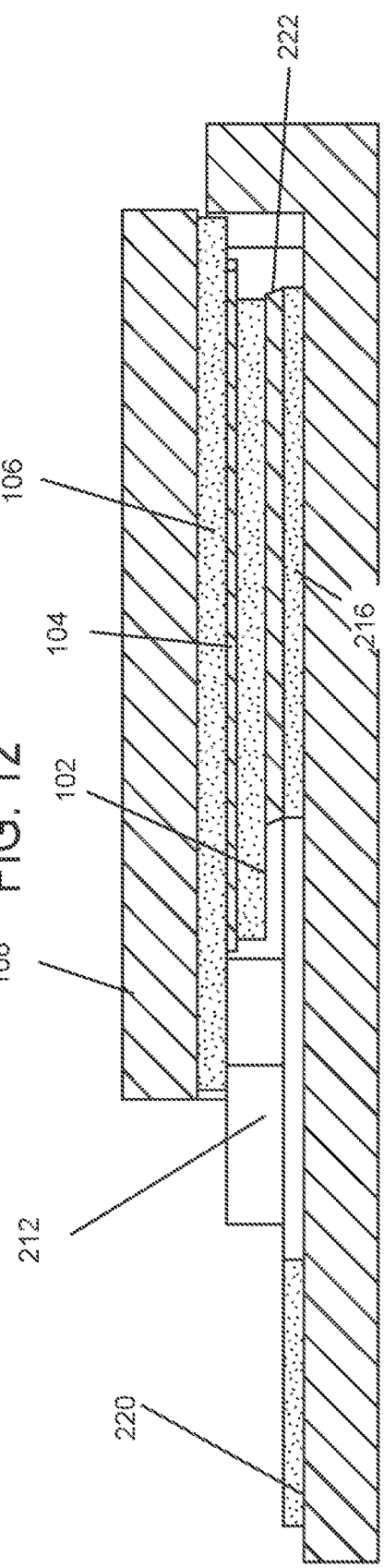
FIG. 12
FIG. 13

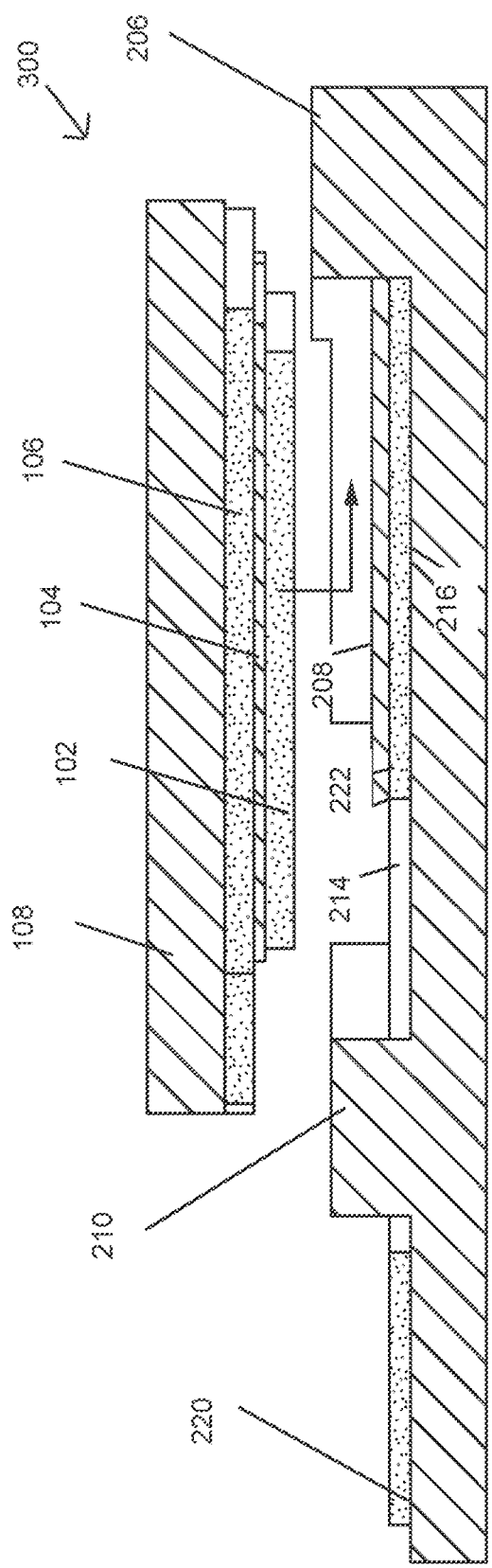
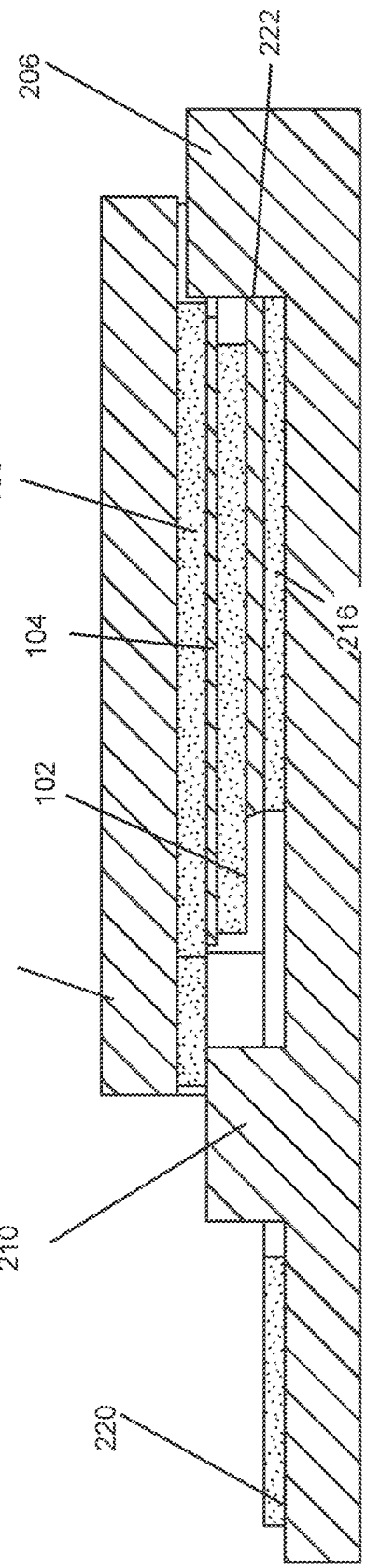
FIG. 14
FIG. 15

TECHNIQUES FOR LASER ALIGNMENT IN PHOTONIC INTEGRATED CIRCUITS

RELATED APPLICATION

This Patent Application is a continuation of U.S. patent application Ser. No. 15/436,474 filed on Feb. 17, 2017, which claims priority to U.S. Provisional Patent Application No. 62/297,735 filed on Feb. 19, 2016, the contents of which are hereby incorporated by reference herein in their entirety.

FIELD OF THE DISCLOSURE

The present disclosure relates generally to semiconductor lasers and, more particularly, to techniques for aligning semiconductor lasers to a Photonic Integrated Circuit (PIC) substrate.

BACKGROUND OF THE DISCLOSURE

Silicon photonics chips require electric current and light to be applied in order to function. The electric current is provided in a similar fashion to that used with other types of silicon chips. However, various approaches have been used, thus far, to provide the light input to PIC substrates to form a PIC. The main approach used for optical coupling is based on active alignment. Using active alignment, light may be generated by powering a laser, energy from which is typically detected downstream. To peak optical coupling, the laser, fiber, lens, or other intermediate objects are precisely moved relative to the detector before fixing the geometry. This approach requires electrical contact to the laser early in the assembly process, which can complicate manufacturability. Below are three examples of light coupling to PIC substrates.

A first example uses an optical fiber that brings light to a PIC substrate. This example uses active alignment of the optical fiber to the PIC substrate, which can be time-consuming and expensive and can produce fragile assembly. Using optical fiber also consumes a large amount of space not just for the fiber, but also for a packaged semiconductor laser that may be connected to the other end of the optical fiber.

A second example uses an externally packaged semiconductor laser diode with a lens and other optical elements, as disclosed in U.S. Pat. No. 8,168,939. Although this example reduces an amount of space used compared to the first example, it still consumes too much space, as well as adds costs associated with the optical elements and required assembly and packaging. This example also typically requires activation of the laser during alignment.

A third example uses a cleaved or etched facet semiconductor laser directly with a silicon photonics chip. This example minimizes overall size, however, it requires either active or passive alignment of the semiconductor laser to the silicon photonics chip, which are time-consuming and add cost.

To address the above shortcomings, some effort has been placed on using passive alignment to reduce cost and speed assembly. In passive alignment, optical fiducials on parts are typically viewed with a microscope imaging system, and the parts are then simply mated and fixed without measuring the optical coupling performance. Passive alignment can be simple and quick, but is severely limited by the cost and time required to achieve needed precision. Resulting alignment precision below 15 microns is prohibitively expensive.

The above challenges and shortcomings associated with current delivery of light to PIC substrates have hindered the ability to use PICs in a beneficial way in applications such as data center connectivity.

SUMMARY OF THE DISCLOSURE

In some embodiments, a photonic integrated circuit (PIC) comprises a semiconductor laser including a forward guide surface and a PIC substrate including a mated surface, wherein the semiconductor laser is aligned in the PIC substrate by placing the semiconductor laser in the PIC substrate and mating the forward guide surface to the mated surface. The guide surfaces may have different shapes, such as triangles or clipped triangles. The mated surface may match the shape of the guide surface, or may contain relief from the guide surface. The mated surface may contain a curved edge. The semiconductor laser and the PIC substrate may contain rulers etched into the substrate to assist in alignment. The alignment may be active via external pushing force, or passive via surface tension with solder or resin. The laser may further contain a facet, and the PIC substrate may contain a waveguide. The facet and waveguide may be angled to prevent back reflection into the laser. The angle may be controlled in either the vertical dimension, horizontal dimension, or both.

In some embodiments, a photonic integrated circuit (PIC) may include a semiconductor laser that includes a laser mating surface and a substrate that includes a substrate mating surface, wherein a shape of the laser mating surface and a shape of the substrate mating surface are configured to align the semiconductor laser with the substrate in three dimensions.

In some embodiments, the shape of the laser mating surface and the shape of the substrate mating surface may be configured to align the semiconductor laser with the substrate when an external force is applied to the semiconductor laser. In some embodiments, the external force may be applied in a direction from the semiconductor laser toward the substrate.

In some embodiments, an edge of the laser mating surface can be configured to contact the substrate mating surface when the semiconductor laser is aligned with the substrate.

In some embodiments, a rear wall of the substrate can be configured to contact a back portion of the semiconductor laser and a side wall of the substrates configured to contact a side surface of the semiconductor laser when the semiconductor laser is aligned with the substrate.

In some embodiments, a portion of the side surface of the semiconductor laser may be configured to be located above a gap portion of the substrate when the semiconductor laser is aligned with the substrate.

In some embodiments, the shape of the laser mating surface can be triangular or trapezoidal. In some embodiments, the shape of the substrate mating surface may be triangular, trapezoidal, square, or rectangular.

In some embodiments, a first edge of the laser mating surface may contact the substrate mating surface, and a second edge of the laser mating surface may not contact the substrate mating surface.

In some embodiments, the substrate mating surface may include a curved edge. In some embodiments, the curved edge maybe configured to distribute an external force applied to the semiconductor laser during an alignment of the semiconductor laser with the substrate.

In some embodiments, the substrate may include a waveguide and the semiconductor laser may include a laser facet, and the waveguide can be configured to receive a laser beam that exits the laser facet.

In some embodiments, the laser facet may be angled and a leading edge of the waveguide may be angled, and the angle of the laser facet and the angle of the leading edge of the waveguide may be configured to reduce a back reflection of the laser beam from the waveguide into the laser facet. Additionally, in some embodiments, the laser facet and the leading edge of the waveguide can be angled in the same direction, and the laser facet can be angled in a vertical direction or a horizontal direction.

In some embodiments, the semiconductor laser may include a contact surface configured to form an electrical connection with the substrate, and the substrate may include a landing area configured to receive the semiconductor laser. In some embodiments, the landing area may include the substrate mating surface, and a contact pad configured to electrically connect to the contact surface of the semiconductor laser.

In some embodiments, solder may be located between the contact pad and the contact surface of the semiconductor laser.

In some embodiments, the landing area may further include a solder layer located on the contact pad and a run-off area that may be configured to receive solder from the solder layer located on the contact pad. In some embodiments, the run-off area can be configured to receive solder by drawing the solder from the solder layer away from the contact pad, and the run-off area may be angled vertically relative to the contact pad.

In some embodiments, a method of fabricating a photonic integrated circuit (PIC) may include arranging a semiconductor laser on a substrate, the semiconductor laser including a laser mating surface and the substrate including a substrate mating surface, and aligning the semiconductor laser with the substrate in three dimensions using a shape of the laser mating surface and a shape of the substrate mating surface.

In some embodiments, the method may include applying an external force to the semiconductor laser in a direction from the semiconductor laser toward the substrate, and distributing the external force using a curved edge of the substrate mating surface.

In some embodiments, the method may include depositing solder on a contact surface of the semiconductor laser prior to arranging the semiconductor laser on the substrate, wherein arranging the semiconductor laser on the substrate may include attaching the contact surface of the semiconductor laser to a contact pad of the substrate. In some embodiments, the solder may be located between the contact surface and the contact pad. In some embodiments, a surface tension of the solder may draw the laser mating surface into attachment with the substrate mating surface.

In some embodiments, a photonic integrated circuit (PIC) substrate may include a substrate mating surface that may be configured contact a semiconductor device mating surface. In some embodiments, a shape of the substrate mating surface can correspond to a shape of the semiconductor device mating surface, and the shape of the substrate mating surface can be configured to align a semiconductor device with the PIC substrate. In some embodiments, the PIC substrate may include a recessed landing area, wherein the recessed landing area may include a contact pad configured to form an electrical connection with a semiconductor device. In some embodiments, the PIC substrate may include a waveguide configured to receive an optical signal produced by a semiconductor device, wherein the waveguide includes an angled front edge. In some embodiments, the angled front edge may be angled in a vertical direction or a horizontal direction. In some embodiments, the shape of the substrate mating surface may be triangular, trapezoidal, square, or rectangular. In some embodiments, the shape of the substrate mating surface may be configured to contact a first edge of a semiconductor device and preserve a space between the substrate mating surface and a second edge of the semiconductor device. In some embodiments, the substrate mating surface may include a curved edge configured to distribute an external force directed toward the substrate mating surface.

In some embodiments, a semiconductor laser may include an active region sandwiched between an upper and lower cladding layer. In some embodiments, the semiconductor laser may include a laser mating surface formed through etching that may be configured to align the semiconductor laser with a substrate mating surface in three dimensions. In some embodiments, a shape of the laser mating surface may correspond to a shape of the substrate mating surface. In some embodiments, the laser may include a contact surface that may be configured to form an electrical connection with the substrate and an etched laser facet that may be configured to exit a laser beam produced by the semiconductor laser. In some embodiments, the laser facet may be angled. In some embodiments, the shape of the laser mating surface may be triangular or trapezoidal. The laser facet may be angled in a vertical direction or a horizontal direction. In some embodiments, a first edge of the laser mating surface can be configured to contact a substrate mating surface when the semiconductor laser is aligned with the substrate. In some embodiments, a back portion of the semiconductor laser can be configured to contact a rear wall of the substrate when the semiconductor laser is aligned with the substrate. In some embodiments, a side surface of the semiconductor laser can be configured to contact a side wall of the substrate when the semiconductor laser is aligned with the substrate. In some embodiments, a portion of the side surface of the semiconductor laser can be configured to be located above a gap portion of the substrate when the semiconductor laser is aligned with the substrate. In some embodiments, a second edge of the laser mating surface can be configured not to contact the substrate mating surface.

In some embodiments, the semiconductor laser may include a semiconductor contact layer above the upper cladding layer, and a metallic contact layer. In some embodiments, a surface of the metallic contact layer may be the contact surface.

In some embodiments, the upper cladding layer may be configured to keep optical loss due to the semiconductor contact layer and metallic contact layer less than 0.3/cm.

In some embodiments, the metallic contact layer may include two electrodes on the same surface. In some embodiments, a first electrode of the two electrodes may correspond to a p-contact of the laser and a second electrode of the two electrodes may correspond to an re-contact of the laser.

The present disclosure will now be described in more detail with reference to particular embodiments thereof as shown in the accompanying drawings. While the present disclosure is described below with reference to particular embodiments, it should be understood that the present disclosure is not limited thereto. Those of ordinary skill in the art having access to the teachings herein will recognize additional implementations, modifications, and embodiments, as well as other fields of use, which are within the scope of the present disclosure as described herein, and with respect to which the present disclosure may be of significant utility.

BRIEF DESCRIPTION OF THE DRAWINGS

In order to facilitate a fuller understanding of the present disclosure, reference is now made to the accompanying drawings, in which like elements are referenced with like numerals. These drawings should not be construed as limiting the present disclosure, but are intended to be illustrative only.

FIG. 10 shows a cross-sectional view of a semiconductor laser and PIC in accordance with an embodiment of the present disclosure.

FIG. 11 shows a cross-sectional view of a semiconductor laser and PIC in accordance with an embodiment of the present disclosure.

FIG. 12 shows a cross-sectional view of a semiconductor laser and PIC in accordance with an embodiment of the present disclosure.

FIG. 13 shows a cross-sectional view of a semiconductor laser and PIC in accordance with an embodiment of the present disclosure.

FIG. 14 shows a cross-sectional view of a semiconductor laser and PIC in accordance with an embodiment of the present disclosure.

FIG. 15 shows a cross-sectional view of a semiconductor laser and PIC in accordance with an embodiment of the present disclosure.

DETAILED DESCRIPTION OF EMBODIMENTS

Figure 1:
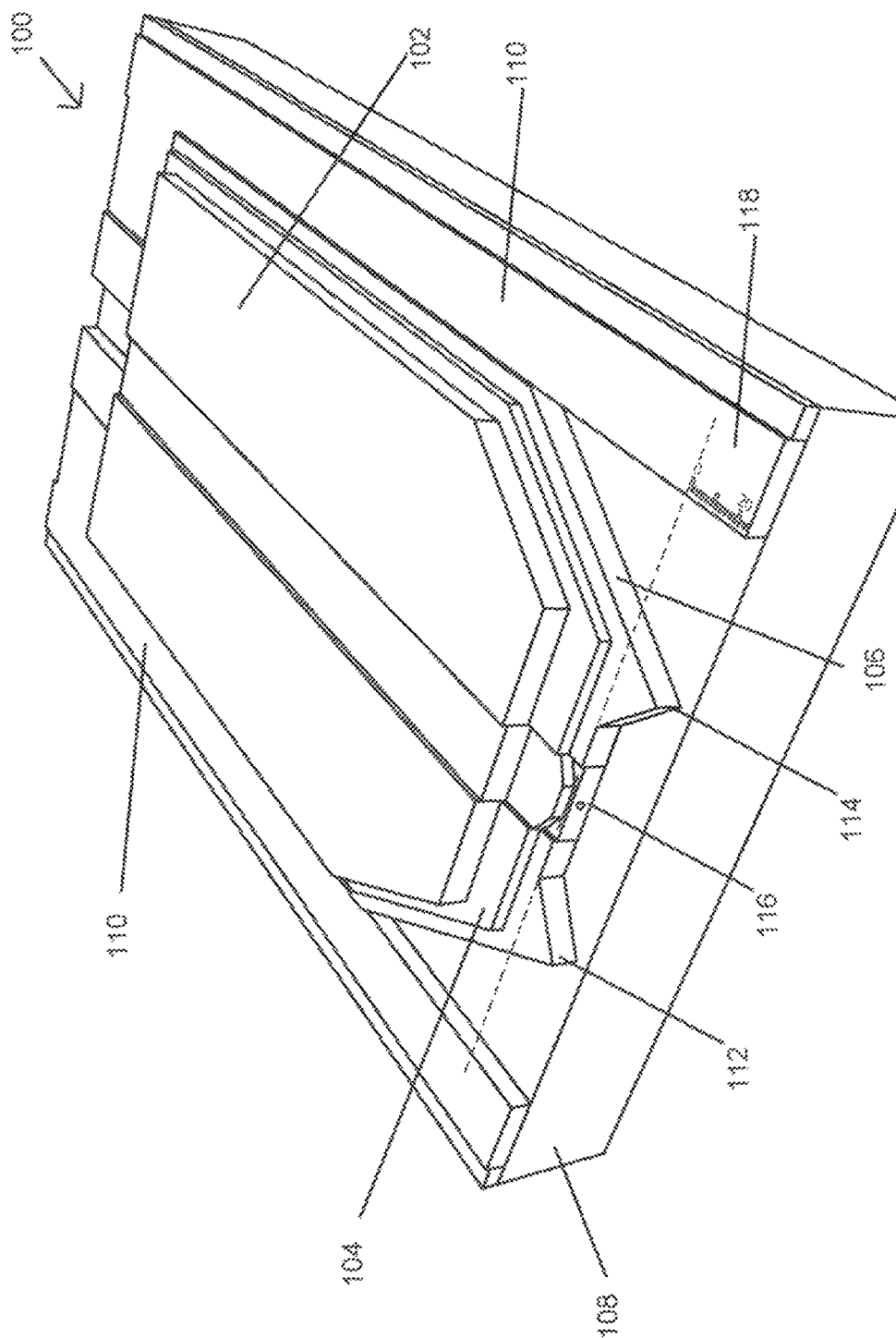
FIG. 1 shows a view of a semiconductor laser in accordance with an embodiment of the present disclosure.

In the following description, numerous specific details are set forth regarding the systems and methods of the disclosed subject matter and the environment in which such systems and methods may operate, etc., in order to provide a thorough understanding of the disclosed subject matter. It will be apparent to one skilled in the art, however, that the disclosed subject matter may be practiced without such specific details, and that certain features, which are well known in the art, are not described in detail in order to avoid complication of the disclosed subject matter. In addition, it will be understood that the examples provided below are exemplary, and that it is contemplated that there are other systems and methods that are within the scope of the disclosed subject matter.

Embodiments of the disclosure are directed to improved alignment techniques for a semiconductor laser in a laser-integrated PIC device. Semiconductor lasers are compact lasers formed through the use of electrically stimulated p-n junctions. Semiconductor lasers provide significant improvements over conventional laser technologies by reducing the power required to operate the laser while also shrinking the size of the laser to the micrometer scale. These improvements allow many lasers to be placed in a single package. Unlike many conventional lasers, semiconductor lasers must generally be directed into a specific guided exit path to make use of the laser light, since the device is too small to direct by hand. Automated techniques which use moveable laser mounts or active lens elements generally require the laser to be activated electrically to emit laser light, i.e. are "actively aligned," and the coupling of light to the PIC is measured in real time while the moveable elements are brought into position. This adds substantial burden, time and cost to the alignment function because the elements must be electrically activate and very accurate feedback control systems must be employed to provide the necessary precision. The assembly of one or more lasers with a PIC through one or more precise alignments of the laser(s) to the PIC forms the basis of the laser integrated PIC. It is to be understood that the laser here represents any of several device types which require tightly controlled assembly motions and precise alignment with a substrate. Not all such alignments need to be optical. Such devices may be lasers, detectors, and optical devices such as filters, modulators, amplifiers, and other circuits, such as imagers and purely electrically connected devices such as high-contact count memory chips.

For conventional semiconductor lasers in PICs, the laser must be very precisely aligned with the substrate for optimal coupling from the laser to the waveguide. For example, for a laser with a mode field diameter on the order of 1 to 3 microns, the alignment accuracy should be within 0.05 to 0.5 microns (50 to 500 nm) to achieve the desired result. Achieving such accuracy is extremely costly and requires significant investment with low production speeds and high rates of error.

Embodiments of the disclosure provide devices and methods for aligning a semiconductor laser with the waveguide of a substrate at significantly greater accuracy. In particular, embodiments of the disclosure provide physical structures in both the laser and the semiconductor substrate that are shaped so that the structures of the laser can be gently pushed or pulled towards matching structures in the PIC substrate. These matching physical structures enable inexpensive alignment through simple thermal and mechanical processes. The device can be aligned via active assembly with self-alignment, and can be aligned via passive assembly with self-alignment.

As will be described in more detail below, embodiments of the disclosure provide precision reference mating surfaces as well as lithographically defined sliding and stop surfaces to allow for fine positioning of the laser on the PIC. These lasers can be aligned to a tolerance of within 100 nm in each of three rectilinear dimensions with high yield using these approaches.

Referring to FIG. 1, a three-dimensional offset view of a semiconductor laser in accordance with an embodiment is shown. In FIG. 1, laser 100 is a semiconductor laser device that is adapted to produce a laser beam of a specific color (i.e., wavelength) during the fabrication process. Laser 100 contains electroplated gold surface 102, conductive layer 104, lower mating surface region 106, upper region 108, and side surfaces 110. Lower mating surface region 106 contains mating surfaces 112 and 114, laser facet 116, and laser ruler 118.

Electroplated gold surface 102 can be a layer of gold that is used for forming an electrical connection with the substrate of a PIC, as will be described in more detail below in FIG. 3. It should be noted that although this surface is electroplated, other deposition techniques other than electroplating (such as evaporation and liftoff) may be used. In addition, although many different thicknesses may be used, in one embodiment, the thickness of electroplated gold surface 102 can be around 5 microns.

Conductive layer 104 can be a stack of a number of metals used to help aid conduction of electrons from electroplated gold surface 102 to lower mating surface region 106 and improve adhesion of the upper conductive layers to the laser or PIC substrate. Conductive layer 104 can contain, for example, a stack of platinum, gold, platinum, and titanium. In one embodiment, the total thickness of this layer can be 1.05 microns.

Lower mating surface region 106 and upper region 108 can collectively comprise the active region of laser 100. Lower mating surface region 106 can contain the actual laser that will be produced by the device. As shown, lower mating surface can contain mating surfaces 112 and 114. Mating surfaces 112 and 114 are physical features that can provide a point of contact between the edge of a PIC and the front of laser 100. As will be shown in FIG. 3, mating surfaces 112 and 114 can contact matching surfaces within a PIC to provide secure and very precise alignment of laser 100 to the semiconductor substrate. In addition, as will be shown in FIGS. 19-21, mating surfaces 112 and 114 can include a variety of shapes different from those shown in FIG. 1.

Figure 4:
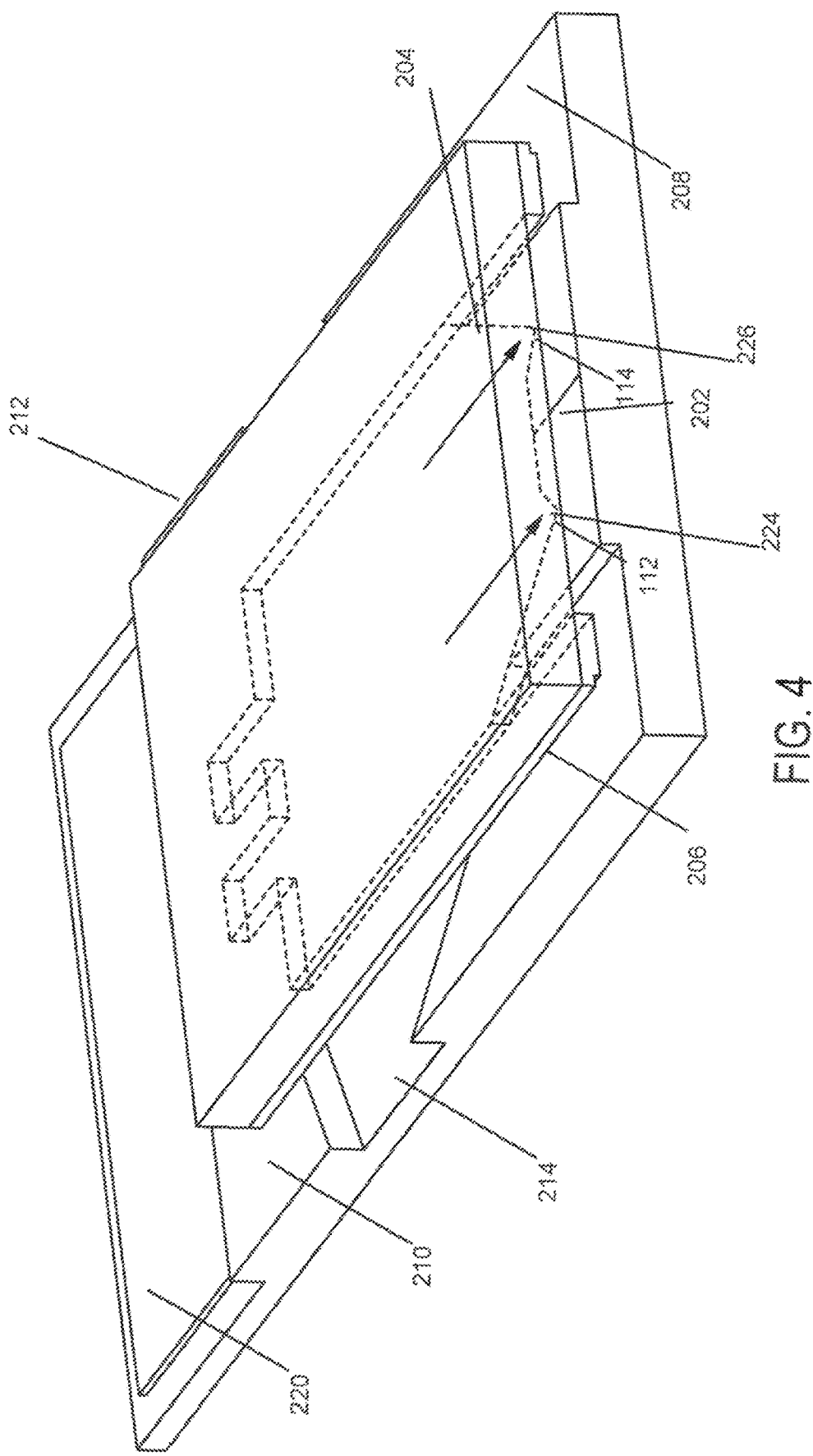
FIG. 4 shows another view of a semiconductor laser and PIC with an embodiment of the present disclosure.

Upper region 108 is the portion of the active region of laser 100 that will not directly contact the substrate of PIC substrate 200. Upper region 108 can be any size that is suitable for the production of a laser in a semiconductor device. After the device is assembled as shown in FIG. 4, upper region 108 can be connected to an external wire to form an electrical connection to a switching mechanism that will control the operation of the laser.

Side surfaces 110 are regions of the laser that are specialized to provide a contact point between the top surface of a PIC and the laser 100. Side surfaces 110 will hold the bulk of the weight of the laser when it is placed into a PIC, and they will also permit the laser 100 to slide smoothly into position when the laser is placed for alignment into the PIC. While lower mating surfaces 106, upper region 108, and side surfaces 110 are described separately, it should be noted that these regions are formed from substantially the same materials and do not contain well defined boundaries between them, except as noted above.

Laser ruler 118 is a pattern on one of side surfaces 110. Laser ruler 118 is etched into the material forming side surfaces 110 to show a distance from the laser facet to the end of the laser device 100. This distance can be used to help determine precise characteristics of the device for alignment of the laser, as described in more detail below.

The material forming the active region of the laser 100 can be formed using any number of lithographic techniques. However, since the vertical position of the laser filament is extremely important to ensure proper functioning of the device, a number of additional techniques can be used to control this height. Thus, the heights of the reference surfaces and associated offsets on both the laser and the PIC substrate side surfaces can be accurately controlled through a variety of precision thin film deposition and removal (subtractive) processes.

For example, several deposition processes in which thin layers of materials are built up onto an underlying reference substrate can be employed. In some embodiments, epitaxial thin film growth of e.g. InP, InGaAs, InGasAsP and other semiconductor or dielectric materials and thin film deposition such as plasma assisted deposition, atomic layer deposition, and others are employed. These can now achieve levels of precision in the range of 100 nm down to single atomic layers.

In other embodiments, one of several subtractive processes, in which individual layers of materials are removed in a precise way to leave a surface with precisely known heights, can be employed. For example, in some embodiments, selective wet and dry etching is used in which the etchant removes the desired material in, for example, a lithographically patterned area, but stops etching as a certain surface or material boundary is reached. Further examples include removal of a silicon dioxide layer using a buffered HF (BHF) solution, which exposes an underlying silicon surface serving as a stop etch layer since the BHF solution does not affect a monolithic silicon surface. Yet another example includes anisotropic wet etching, such as using KOH to etch down to and expose a particular crystallographic plane within the body of, for example, a silicon substrate. Still another example is to etch down through an InP layer using an HCl solution, which would then stop at an InGaAsP layer within the body of the etched component. For example, the etching described in this disclosure may be used to etch mating surfaces of the laser 100.

Finally, non-selective etchants such as gaseous SF6 dry etching can be used to etch into a surface by an amount determined by the etch time, substrate temperature, or real time in situ measurement. These subtractive processes can have precision comparable to the additive processes discussed above. Both additive and subtractive processes for both vertical and lateral reference position control are employed. These processes can be mixed and matched in combination according to the need to provide the desired resultant surface features in both vertical and lateral dimensions.

Figure 2:
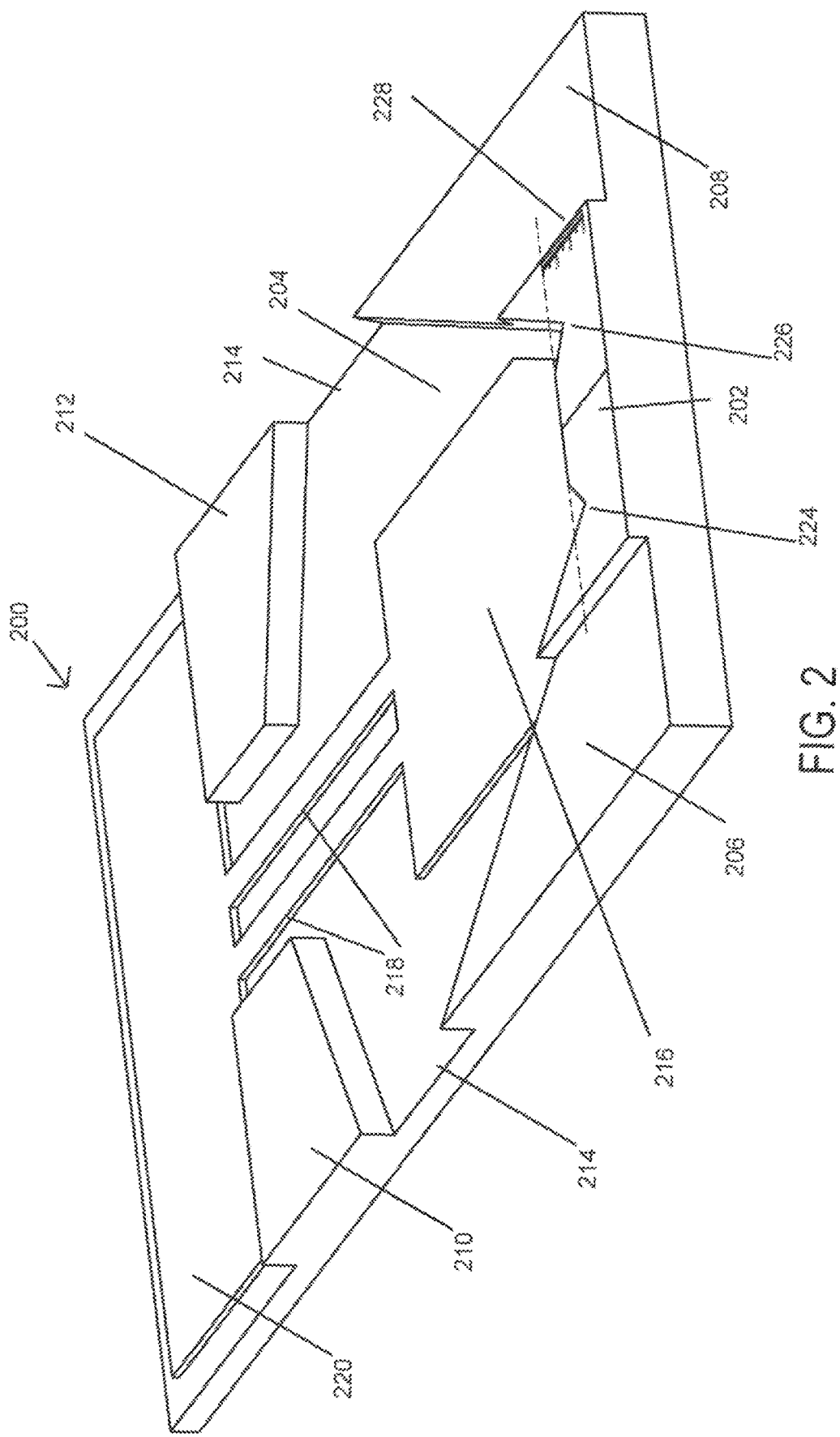
FIG. 2 shows a view of a PIC in accordance with an embodiment of the present disclosure.
Figure 8:
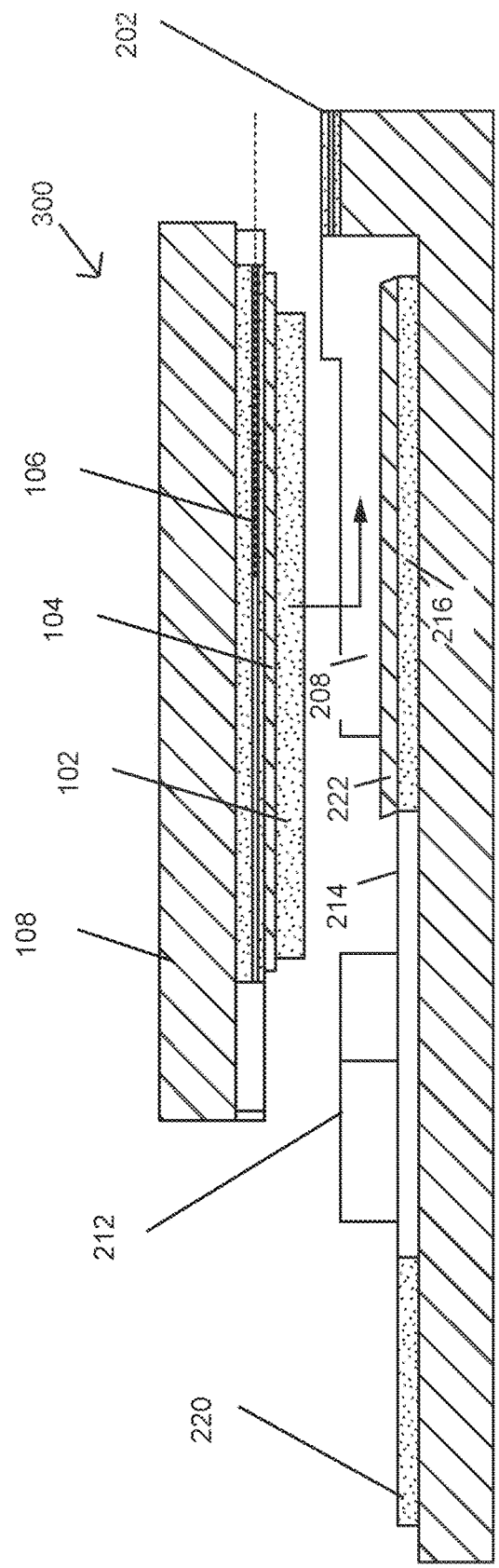
FIG. 8 shows a cross-sectional view of a semiconductor laser and PIC in accordance with an embodiment of the present disclosure.

Referring to FIG. 2, a three-dimensional offset view of a semiconductor laser PIC in accordance with an embodiment of the present disclosure is shown. In FIG. 2, PIC substrate 200 is an assembly adapted to house laser 100 for the production of a laser beam in a semiconductor substrate. PIC substrate 200 contains waveguide 202, recessed landing area 204, front side walls 206 and 208, back side walls 210 and 212, gaps 214, laser contacting conductive pad 216, wire contacting conductive connections 218, wire contacting conductive pad 220. PIC substrate 200 may further include solder 222 arranged on laser contacting conductive pad 216, which is shown in FIG. 8. Laser landing area 204 contains mating surfaces 224 and 226. In addition, waveguide 202 contains PIC ruler 228.

Waveguide 202 is a structure adapted to guide the beam of an incident laser through the substrate. Waveguide 202 is an element formed on top of the semiconductor substrate. Waveguide 202 can be, for example, a sandwich of deposited materials including a lower oxide layer, a thin conductive layer, and an upper oxide layer. The thin conductive layer can be a layer that is adapted to permit transmission of a laser beam through the semiconductor substrate. In one exemplary implementation, the thin conductive layer can be silicon. In one embodiment, the lower oxide layer can be 2 micrometers, the thin conductive layer can be 220 nanometers, and the upper oxide layer can be 2.1 micrometers.

Generally, the remaining structures of PIC substrate 200 are formed by etching the structures shown in FIG. 2 into a semiconductor substrate, unless otherwise noted. Recessed landing area 204 is a recession in the substrate of PIC substrate 200 formed by etching. Recessed landing area 204 is the area into which laser 100 will be placed, as shown in FIG. 3. Recessed landing area 204 can be a constant depth that permits firm contact between electroplated gold surface 102 and solder 222. In one embodiment, recessed landing area can be approximately 10 micrometers below the rest of the substrate. The shape of recessed landing area 204 and the remaining non-etched areas of PIC substrate 200 are carefully selected to permit simple alignment of the laser 100 when it is placed in PIC substrate 200, as described more fully below.

Front side walls 206 and 208 comprise upper surfaces of the PIC device 200 that have not been etched. Front side walls 206 and 208 are adapted to permit direct contact with side surfaces 110 of the laser device 100 to support the weight of the device when it is placed in the substrate. As will be shown in FIG. 4, front side walls 206 and 208 will be aligned with the front end of side surfaces 110 of laser 100. Similarly, back side walls 210 and 212 of the PIC substrate 200 are adapted to contact the back portion of side surfaces 110 of the laser 100 to hold the remainder of the weight of the laser.

Gaps 214 are areas of the PIC substrate 200 that have been etched away and occupy the space between front side walls 206 and 208, and the corresponding back side walls 210 and 212. Gaps 214 are particularly shaped to allow room for imprecise initial placement of laser 100 into the semiconductor substrate. Gaps 214 may provide a run-off area for reflow solder. For example, gaps 214 may be configured to draw excess solder away from reflow solder located on one or more of laser contacting conductive pad 216, wire contacting conductive connections 218, and wire contacting conductive pad 220. Gaps 214 may receive the drawn solder. As shown by FIG. 2, gaps 214 may be angled horizontally relative to one or more of laser contacting conductive pad 216, wire contacting conductive connections 218, and wire contacting conductive pad 220, where back side walls 210 and 212 and front side walls 206 and 208 may define the angles. Gaps 214 may also be angled vertically relative to one or more of laser contacting conductive pad 216, wire contacting conductive connections 218, and wire contacting conductive pad 220. Gaps 214 may be dimensioned such that excess solder that it receives does not reach back side walls 210 and 212 and front side walls 206 and 208.

Gaps 214 may also provide a reservoir area for solder. For example, solder can be placed in one or more of gaps 214 and wicked to one or more of laser contacting conductive pad 216, wire contacting conductive connections 218, and wire contacting conductive pad 220. The wicked solder may therefore be used to aid in the attachment of substrate 200 to laser 100.

Figure 19:
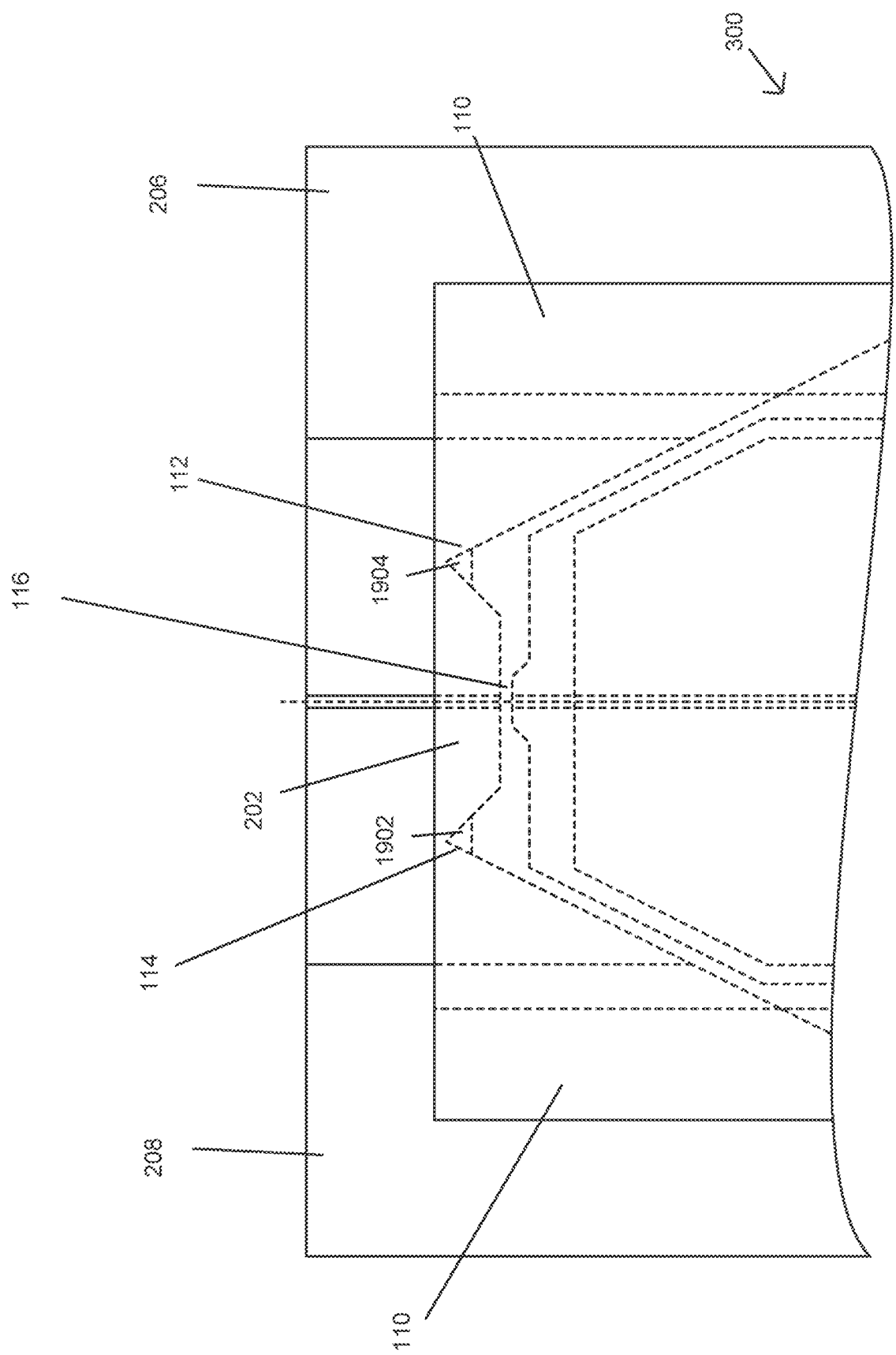
FIG. 19 shows a top-down view of a semiconductor laser and PIC in accordance with an embodiment of the present disclosure.
Figure 20:
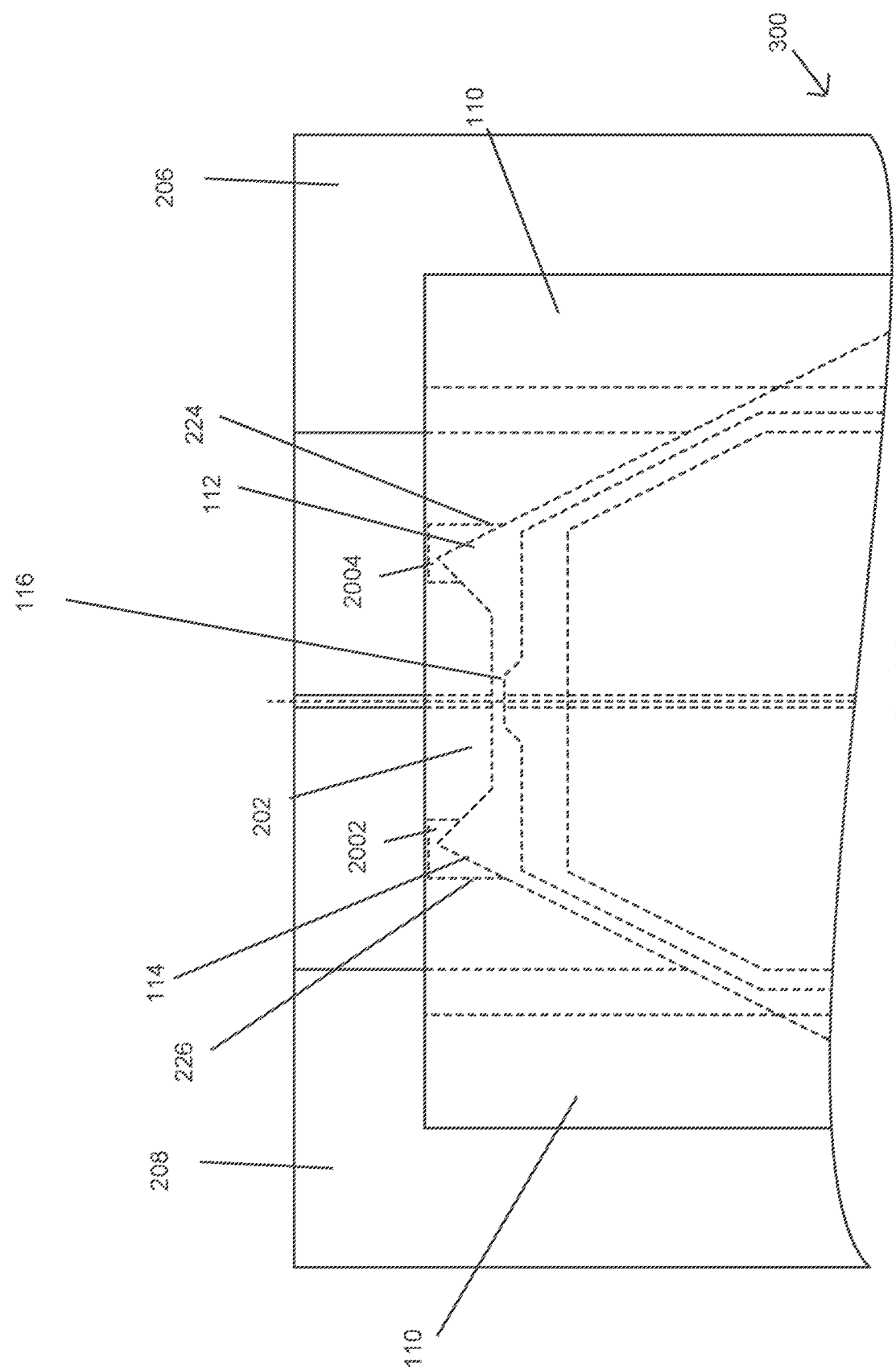
FIG. 20 shows a top-down view of a semiconductor laser and PIC in accordance with an embodiment of the present disclosure.
Figure 21:
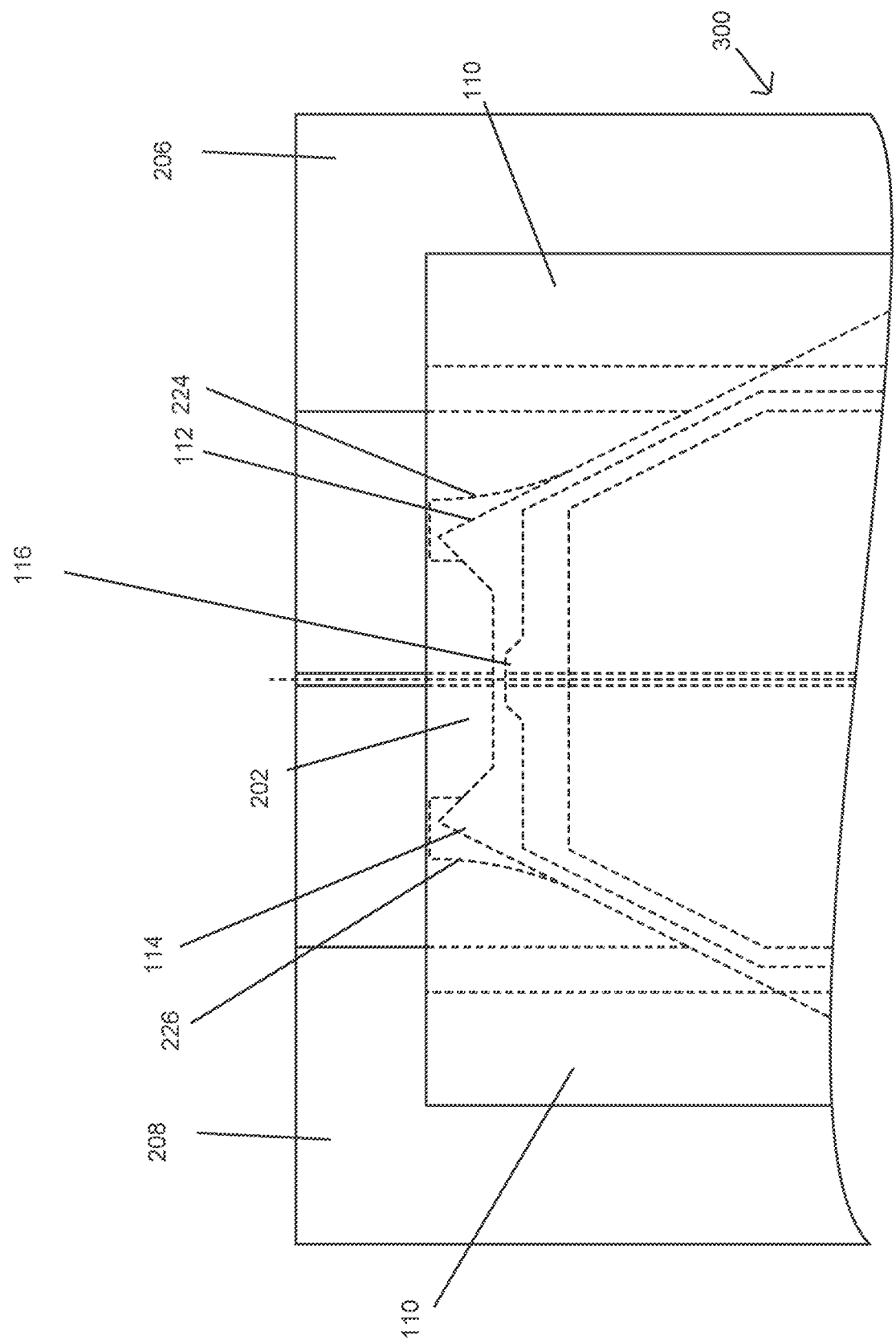
FIG. 21 shows a top-down view of a semiconductor laser and PIC in accordance with an embodiment of the present disclosure.

Embodiments of the disclosure advantageously generate a particular shape for recessed landing area 204 that is specially adapted to assist in alignment of laser 100 within the PIC substrate. In particular, the shape of this area allows alignment of the laser 100 through active or passive alignment techniques, as explained more fully below in FIGS. 3-6. Laser landing area 204 contains mating surfaces 224 and 226 that are shaped to correspond with mating surfaces 112 and 114 of laser 100. In FIGS. 1 and 2, the mating surfaces are shown to be triangular. However, this shape is not required, and a number of other shapes are contemplated for use as mating surfaces, as shown in FIGS. 19-21. For example, the mating surface may be trapezoidal, corresponding to a clipped version of a triangle, to provide a larger contact area between the mating surfaces.

Laser contacting conductor pad 216 is a region within recessed laser landing area 204 into which a conductive element has been placed. In one embodiment, the conductive element of laser contacting conductor pad 216 can be a sandwich of materials comprising titanium, platinum, and gold. In one embodiment, this pad can have a height of approximately 0.75 micrometers. Laser contacting conductor pad 216 is adapted to hold solder 222 that will be used to form an electrical connection between PIC substrate 200 and laser 100. Solder 222 can be any soldering material adapted to create this electrical connection. In one embodiment, solder 222 can be a gold-tin mixture of approximately 5 micrometers in height. In one embodiment, solder 222 can be deposited on laser 100 instead of PIC substrate 200.

Conductive connections 218 are two lines running through PIC substrate 200 that connect laser contacting conductor pad 216 to wire contacting conductive pad 220. Wire contacting conductive pad 220 is a large, exposed region at the back of PIC substrate 200 that permits attachment of an external wire to electrically control the PIC assembly.

PIC ruler 228 is a pattern on one of side of the waveguide 202. PIC ruler 228 is etched into the material the waveguide 202 to show a distance from the front edge of the waveguide 202 to the end of the PIC substrate 200. In conjunction with laser ruler 118, this distance can be used to help determine precise characteristics of the device for alignment of the laser. For example, the distance from the laser face to the end of laser 100 can be precisely determined via laser ruler 118. In addition, the distance between the front edge of waveguide 202 and the edge of the PIC substrate 200 can be determined. When the laser 100 is placed into the PIC substrate 200 as described in FIGS. 3-6, the combination of these measurements from rulers 118 and 228 can be used to determine the precise distance between the laser facet 116 and the front edge of waveguide 202. A second ruler can be added, for example, at a position symmetric around waveguide 202, to determine the relative tilt angle between laser 100 and PIC substrate 200.

Figure 3:
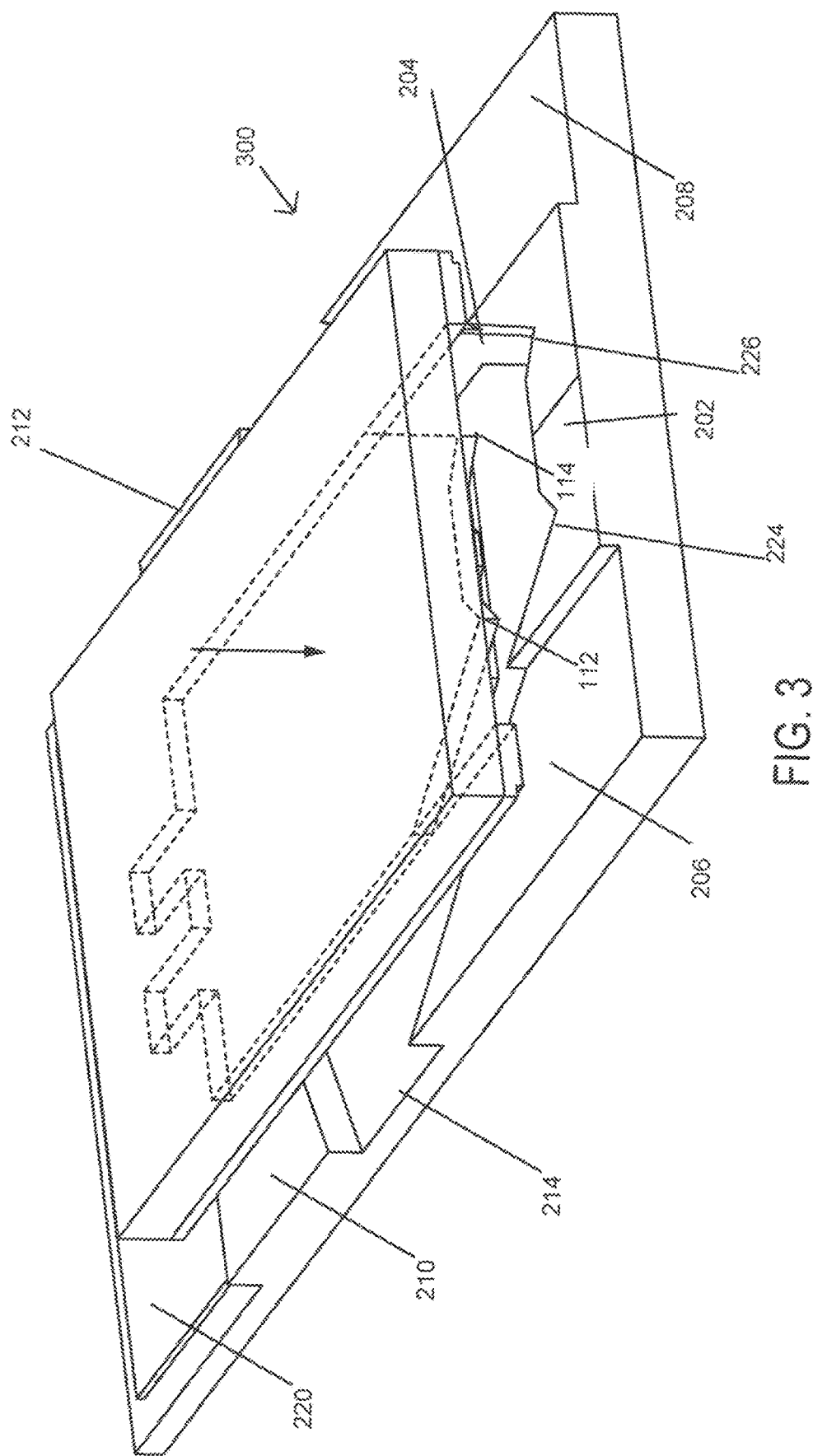
FIG. 3 shows a view of a semiconductor laser and PIC in accordance with an embodiment of the present disclosure.

Referring to FIG. 3, a three-dimensional offset view of a PIC assembly in accordance with an embodiment of the present disclosure is shown. In FIG. 3, PIC 300 is the combination of semiconductor laser 100 and PIC substrate 200. To achieve the configuration in FIG. 3, the laser of FIG. 1 is flipped upside-down so that electroplated gold surface 102 points down towards the top of the substrate of PIC substrate 200, as shown.

FIG. 3 illustrates the configuration of the device when laser 100 is initially placed into PIC substrate 200 in a pre-aligned configuration. It should be understood that when the device is pre-aligned as shown, the laser 100 is placed so that the laser is in perfect alignment with waveguide 202, but is also some distance behind it. This perfect alignment is an idealized example, and it should be understood that the laser 100 will generally not be in a pre-aligned configuration when it is placed.

In FIG. 3, laser 100 is initially placed so that mating surfaces 112 and 114 are at a distance far from contacting mating surfaces 224 and 226 of PIC substrate 200. Laser 100 can be placed by any device that can carry laser 100 without damaging it. In some embodiments, laser 100 is placed via a suction cup assembly. At this stage, side surfaces 110 should be in direct contact with front side walls 206 and 208, as well as back side walls 210 and 212, as shown. A portion of each of side surfaces 110 will be above the gaps 214. In this configuration, at least a portion of electroplated gold surface 102 will be in contact with solder 222. However, the leading edge of the electroplated gold surface will be substantially at some distance from the front of the solder 222.

Referring to FIG. 4, a three-dimensional offset view of a PIC assembly in accordance with an embodiment of the present disclosure is shown. In FIG. 4, PIC 300 contains semiconductor laser 100 and PIC substrate 200. FIG. 4 illustrates the completion of the assembly of the PIC 300 so that laser 100 is aligned for transmission of produced laser light into the waveguide 202 of PIC substrate 200. To achieve the configuration in FIG. 4, the laser 100 shown in FIG. 3 can be pushed forward either actively or passively. When the laser 100 is aligned actively, the laser device 100 must be turned on to generate a reference point for correction of the device's position. An external force is then applied to the laser 100 to cause the device to move towards the waveguide 202. In some embodiments, the laser can be pushed forward via a suction cup attached to the upper region 108 of laser 100.

In other embodiments, the laser 100 can also be aligned passively. In these embodiments, the laser is not turned on when it is aligned; rather, the alignment process utilizes the shape of the reference surfaces in laser 100 and PIC substrate 200 to correct misalignments and move the laser into the proper position with PIC 300. In this embodiment, the laser can be pushed actively by an external force. In an alternative embodiment, the laser 100 can self-align without any external forces being applied. The alignment forced is provided when the laser 100 is pulled forward through the action of surface tension via direct contact with a liquid on the surface of PIC substrate 200. In some embodiments, this liquid can be solder 222 that has been heated to become molten. In these embodiments, solder 222 can fluidly couple to electroplated gold surface 102 and conductive connections 218. In these embodiments, the surface tension of the molten solder can cause a weak force to be applied to the laser 100, causing the laser to be gently pulled forward towards the mating surfaces 224 and 226. In yet another embodiment, the laser can be pushed forward via a combination of active and passive alignment. Although surface tension with solder 222 is described as providing this surface tension, other materials such as epoxy or resin can be used as well.

When the laser is pushed forward, mating surfaces 112 and 114 will be firmly contacting mating surfaces 224 and 226 of PIC substrate 200. At this stage, side surfaces 110 should be in direct contact with front side walls 206 and 208, as well as back side walls 210 and 212. A portion of each of side surfaces 110 will be above the gaps 214; however, this portion will be different from the portion that was above the gaps in FIG. 3. In this configuration, electroplated gold surface 102 will initially be in fluid contact with solder 222, and eventually couple to solid, cooled solder 222. In addition, the leading edge of the electroplated gold surface will be substantially aligned with the front edge of the solder 222. At this stage, the alignment of the laser is complete, and the laser 100 will be aligned in the PIC substrate 200 to very precise measurements.

Figure 5:
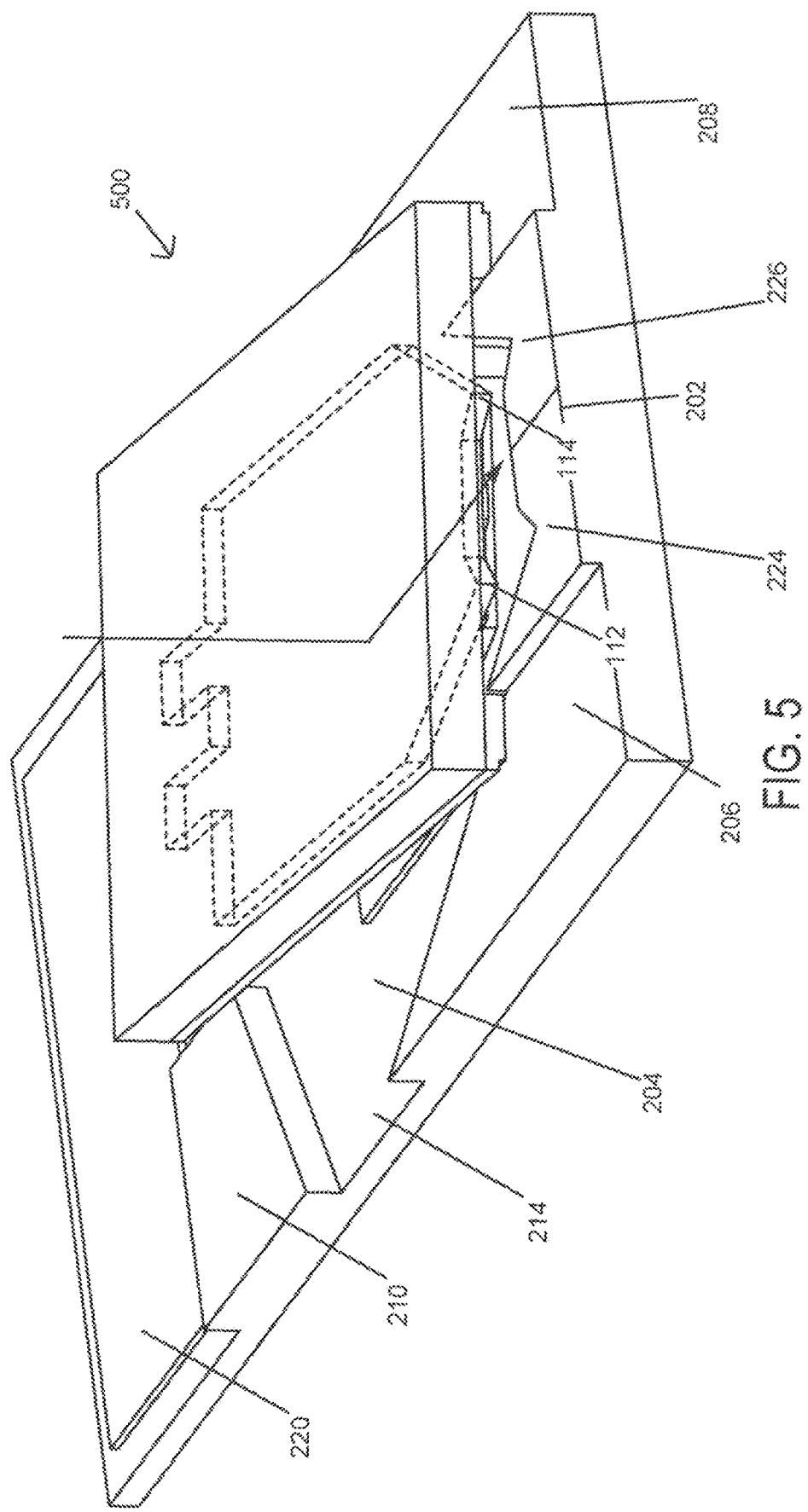
FIG. 5 shows an alternate placement of a semiconductor laser and PIC in accordance with an embodiment of the present disclosure.

Referring to FIG. 5, a three-dimensional offset view of an alternate arrangement of a semiconductor laser 100 and PIC substrate 200 into PIC 300 in accordance with an embodiment of the present disclosure is shown. FIG. 5 illustrates the placement of laser 100 into PIC substrate 200 as in FIG. 3; however, unlike in FIG. 3, the laser 100 is misaligned in one or more dimensions so that laser facet 116 will not be lined up with the waveguide 202 as it is initially placed. As indicated above, there are substantial difficulties with placing the laser 100 into the PIC substrate 200 so that the laser facet 116 and the waveguide 202 are aligned. In particular, when the laser 100 is placed, it can be misaligned in any of three spatial dimensions (e.g., horizontal, vertical, and back-forward). Thus, a method of correcting the potential misalignment of the laser 100 is desirable. FIG. 5 illustrates one potential misalignment of the laser 100; however, it should be understood that the laser 100 can be misaligned to varying degrees in any spatial dimension.

Figure 6:
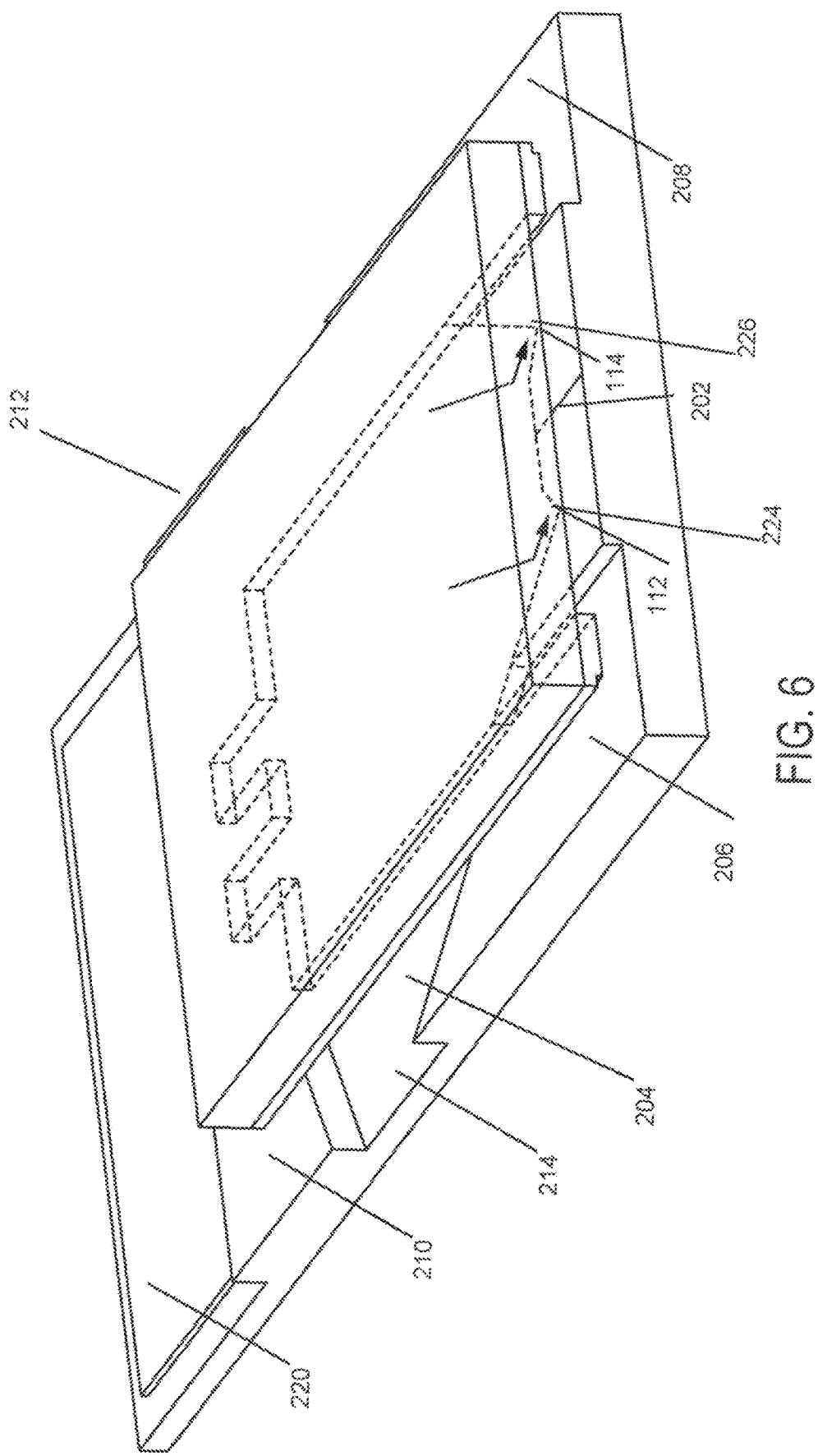
FIG. 6 shows a further view of an alternate placement of a semiconductor laser and PIC with an embodiment of the present disclosure.

Referring to FIG. 6, a three-dimensional offset view of an alternate arrangement of a semiconductor laser and PIC assembly in accordance with an embodiment of the present disclosure is shown. In FIG. 6, PIC assembly 500 contains semiconductor laser 100 and PIC substrate 200. FIG. 6 illustrates the alignment of laser 100 into PIC substrate 200. In FIG. 6, the laser 100 in FIG. 5 is pushed forward via an active or passive process as described above so that mating surfaces 112 and 114 firmly contact mating surfaces 224 and 226 of PIC substrate 200. Unlike in FIG. 3, the laser 100 in FIG. 5 was initially misaligned with the semiconductor substrate and waveguide 202. Since using alignment of the laser requiring activation of the laser is both difficult and costly, it is desirable to correct the misalignment using only the passive process described above.

FIG. 6 illustrates the action of the innovative design of the present disclosure whereby the shape of mating surfaces 112 and 114 and mating surfaces 224 and 226 leads to natural alignment of the laser 100 with the PIC substrate 200 when the laser 100 is pushed or pulled forward. In particular, the shape of these mating surfaces causes the laser to move into alignment with the waveguide 202 when the pushing or pulling force on laser 100 is applied. In this way, the shape of these matching surfaces will cause the laser 100 to move into position and align laser facet 116 with waveguide 202 in a very precise manner. Thus, the assembly of FIG. 6 matches the assembly in FIG. 4, despite the laser 100 being placed in a very different initial position in FIGS. 3 and 5, and the only external aligning force being applied in one dimension, from the back of laser 100 towards the front of PIC substrate 200. Advantageously, this design allows the laser 100 to self-align with PIC substrate 200 to a very high degree of accuracy from any number of possible initial positions.

As in FIG. 4, once the laser 100 is aligned to its final position, side surfaces 110 should be in direct contact with front side walls 206 and 208, as well as back side walls 210 and 212. A portion of each of side surfaces 110 will be above the gaps 214; however, this portion will be different from the portion that was above the gaps in FIG. 5. In this configuration, electroplated gold surface will be in contact with solder 222, and the leading edge of the electroplated gold surface will be substantially aligned with the front edge of the solder 222. It should be noted that although FIGS. 1-6 illustrate the alignment of the laser 100 with PIC substrate 200 via matching, pointed mating surfaces 112, 114, 224, and 226, this shape is not required, and alternate shapes may be shown or preferred. Some examples of alternative mating surfaces are illustrated in FIGS. 19-21.

Figure 7:
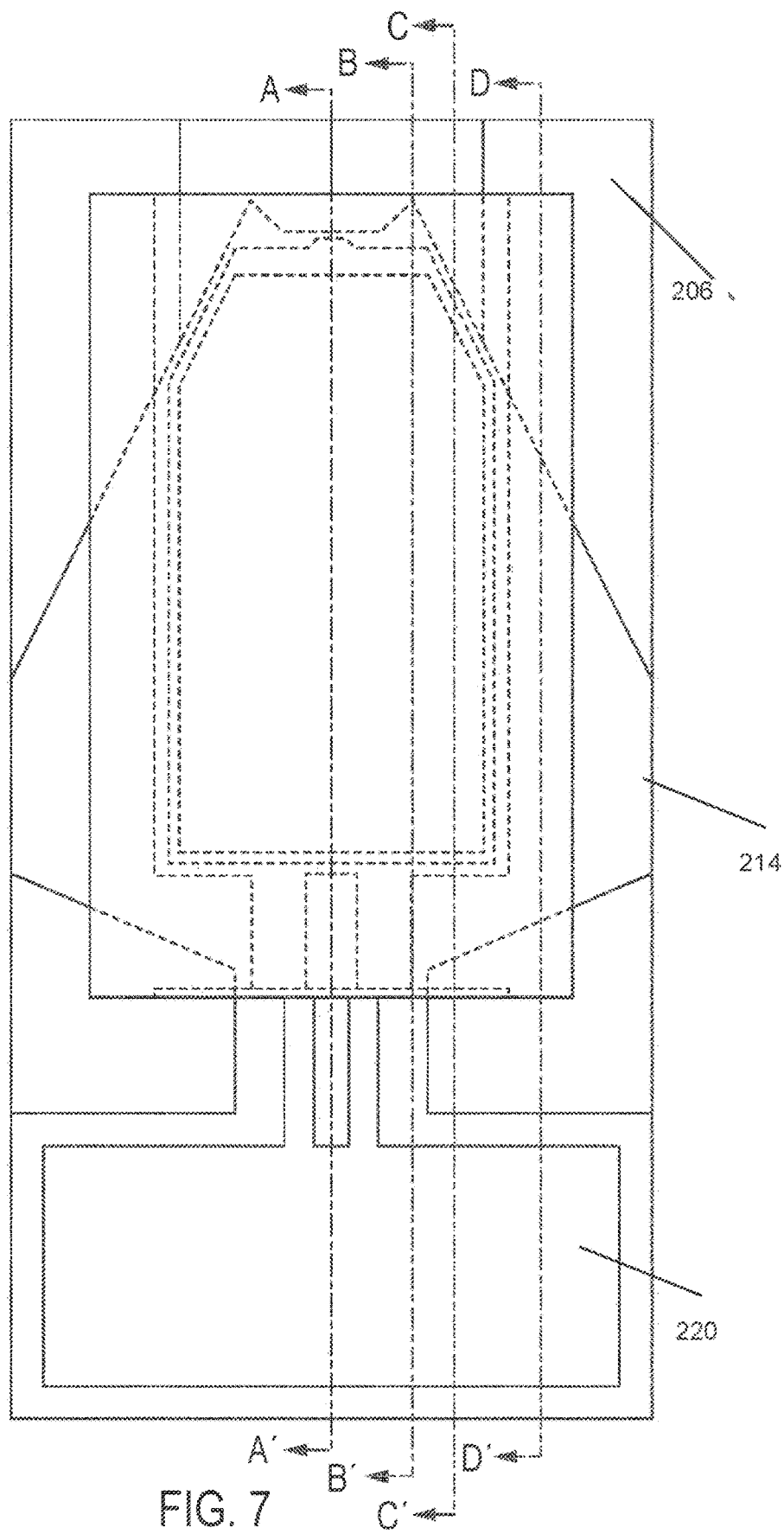
FIG. 7 shows a top-down view of a semiconductor laser and PIC in accordance with an embodiment of the present disclosure.

Referring to FIG. 7, a top-down view of a semiconductor laser and PIC in accordance with an embodiment of the present disclosure. In FIG. 7, laser 100 contains electroplated gold surface 102, conductive layer 104, lower mating surface region 106, upper region 108, and side surfaces 110. Lower mating surface region 106 contains mating surfaces 112 and 114, and laser facet 116. In addition, PIC substrate 200 contains waveguide 202, laser landing area 204, side walls 206 and 208, and conductive pad 210. Laser landing area 204 contains mating surfaces 224 and 226. FIG. 7 further illustrates the planes along which cross-sections A-A', B-B', C-C', and D-D' will be taken, as shown in FIGS. 8-17.

Referring to FIG. 8, a cross-sectional view of a semiconductor laser 100 and PIC substrate 200 in accordance with an embodiment of the present disclosure is shown. In particular, FIG. 8 shows the A-A' cross section illustrated in FIG. 7, taken through the center of the active region of laser 100. FIG. 8 particularly shows this cross-section prior to the placement of the laser 100 into the PIC substrate 200. In FIG. 8, laser 100 contains electroplated gold surface 102, conductive layer 104, lower mating surface region 106, upper region 108, and side surfaces 110. Lower mating surface region 106 contains mating surfaces 112 and 114, and laser facet 116. In addition, PIC substrate 200 contains waveguide 202, laser landing area 204, side walls 206 and 208, and conductive pad 210. Laser landing area 204 contains mating surfaces 224 and 226. PIC substrate 200 also contains solder 222, which can be heated to form a liquid for bonding to electroplated gold surface 102, as described above.

Figure 9:
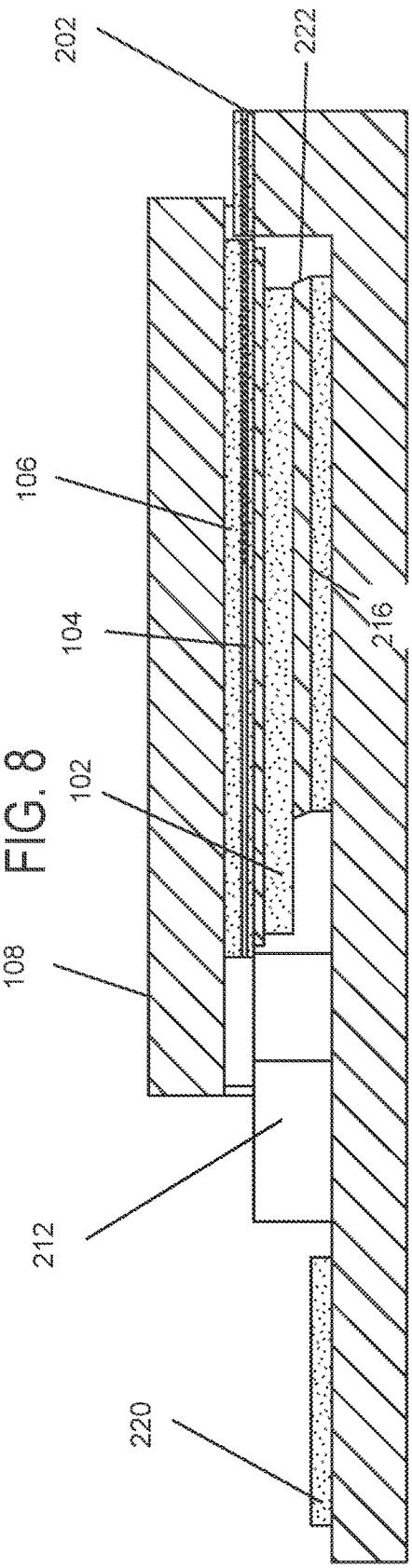
FIG. 9 shows a cross-sectional view of a semiconductor laser and PIC in accordance with an embodiment of the present disclosure.

Referring to FIG. 9, a further cross-sectional view of a semiconductor laser and PIC in accordance with an embodiment of the present disclosure is shown. In particular, FIG. 9 shows the A-A' cross section illustrated in FIG. 7, taken through the center of the active region of laser 100. FIG. 9 particularly shows this cross-section after the laser 100 in FIG. 8 has been placed into the PIC substrate 200 and aligned. The arrangement of FIG. 9 corresponds to a cross section taken when the assembly 300 is in the configuration shown in FIG. 4. In FIG. 9, the laser 100 in FIG. 8 is has been pushed or pulled forward to create alignment of the laser facet 116 with the waveguide 202 so that mating surfaces 112 and 114 firmly contact mating surfaces 224 and 226 of PIC substrate 200. At this stage, side surfaces 110 should be in direct contact with front side walls 206 and 208, as well as back side walls 210 and 212. A portion of each of side surfaces 110 will be above the gaps 214; however, this portion will be different from the portion that was above the gaps in FIG. 8. In this configuration, electroplated gold surface will be in contact with solder 222, which may pull the laser 100 towards the front of PIC substrate 200 via surface tension. In addition, the leading edge of the electroplated gold surface will be substantially aligned with the front edge of the solder 222.

Referring to FIG. 10, a cross-sectional view of semiconductor laser 100 and PIC substrate 200 in accordance with an alternate embodiment of the present disclosure is shown. In particular, FIG. 10 shows the A-A' cross section illustrated in FIG. 7, taken through the center of the active region of laser 100. FIG. 10 particularly shows this cross-section prior to the placement of the laser 100 into the PIC substrate 200. In FIG. 10, laser 100 contains electroplated gold surface 102, conductive layer 104, lower mating surface region 106, upper region 108, and side surfaces 110. Lower mating surface region 106 contains mating surfaces 112 and 114, and laser facet 116. In addition, PIC substrate 200 contains waveguide 202, laser landing area 204, side walls 206 and 208, and conductive pad 210. Laser landing area 204 contains mating surfaces 224 and 226. PIC substrate 200 also contains solder 222, which can be heated to form a liquid for bonding to electroplated gold surface 102, as described above.

FIG. 10 illustrates the placement of laser 100 into PIC substrate 200 as shown in FIG. 8, with an important difference. In FIG. 10, the facet 116 of laser 100 is not straight, but rather is angled in the vertical direction, as shown. This angle is precisely controlled during the fabrication process by etching the edge of the facet to a high degree of precision. Providing this angle on the front of the laser facet 116 will cause the laser beam to exit the facet and be angled upward, as shown. Accordingly, in FIG. 10, the leading edge of the waveguide 202 is also angled in the vertical direction to allow the waveguide 202 to receive and redirect the laser light so that it continues straight along the waveguide 202. In some embodiments, the angle of the leading edge of waveguide 202 can be approximately three times as steep as the angle of facet 116.

Referring to FIG. 11, a cross-sectional view of a semiconductor laser and PIC in accordance with an embodiment of the present disclosure is shown. In particular, FIG. 11 shows the A-A' cross section illustrated in FIG. 7, taken through the center of the active region of laser 100. FIG. 11 particularly shows this cross-section after the laser 100 in FIG. 10 has been placed into the PIC substrate 200 and aligned. FIG. 11 is an alternate embodiment of FIG. 9 in which angled facet 116 and angled leading edge of waveguide 202 are provided as shown. In this figure, the laser light bends upward after leaving the angled facet 116, and reaches angled leading edge of waveguide 202 at some vertical offset above the source of the laser. This arrangement of the laser 100 prevents undesirable back reflection of the laser from the waveguide 202 into the laser facet 116.

Referring to FIG. 12, a cross-sectional view of a semiconductor laser and PIC in accordance with an embodiment of the present disclosure is shown. In particular, FIG. 12 shows the B-B' cross section illustrated in FIG. 7. FIG. 12 particularly shows this cross-section when the laser is in the configuration shown in FIG. 2. In FIG. 12, laser 100 contains electroplated gold surface 102, conductive layer 104, lower mating surface region 106, upper region 108, and side surfaces 110. Lower mating surface region 106 contains mating surfaces 112 and 114, and laser facet 116. In addition, PIC substrate 200 contains waveguide 202, laser landing area 204, side walls 206 and 208, and conductive pad 210. Laser landing area 204 contains mating surfaces 224 and 226.

FIG. 12 illustrates the placement of laser 100 into PIC substrate 200 in a pre-aligned configuration. In FIG. 12, laser 100 is initially placed so that mating surfaces 112 and 114 are at a distance far from contacting mating surfaces 224 and 226 of PIC substrate 200. At this stage, side surfaces 110 should be in direct contact with front side walls 206 and 208, as well as back side walls 210 and 212. A portion of each of side surfaces 110 will be above the gaps 214. In this configuration, electroplated gold surface will be in contact with solder 222. However, the leading edge of the electroplated gold surface will be substantially at a distance from the front of the solder 222.

Referring to FIG. 13, a cross-sectional view of a semiconductor laser and PIC in accordance with an embodiment of the present disclosure is shown. In particular, FIG. 13 shows the B-B' cross section illustrated in FIG. 7. FIG. 13 particularly shows this cross-section when the laser is in the configuration shown in FIG. 4. In FIG. 13, PIC assembly 300 contains semiconductor laser 100 and PIC substrate 200. FIG. 13 illustrates the alignment of laser 100 into PIC substrate 200. In FIG. 13, the laser 100 in FIG. 12 is pushed forward so that mating surfaces 112 and 114 are firmly contacting mating surfaces 224 and 226 of PIC substrate 200. At this stage, side surfaces 110 should be in direct contact with front side walls 206 and 208, as well as back side walls 210 and 212. A portion of each of side surfaces 110 will be above the gaps 214; however, this portion will be different from the portion that was above the gaps in FIG. 12. In this configuration, electroplated gold surface will be in contact with solder 222, and the leading edge of the electroplated gold surface will be substantially aligned with the front edge of the solder 222. Referring to FIG. 14, a cross-sectional view of a semiconductor laser and PIC in accordance with an embodiment of the present disclosure is shown. In particular, FIG. 14 shows the C-C' cross section illustrated in FIG. 7. FIG. 14 particularly shows this cross-section when the laser is in the configuration shown in FIG. 2. In FIG. 14, laser 100 contains electroplated gold surface 102, conductive layer 104, lower mating surface region 106, upper region 108, and side surfaces 110. Lower mating surface region 106 contains mating surfaces 112 and 114, and laser facet 116. In addition, PIC substrate 200 contains waveguide 202, laser landing area 204, side walls 206 and 208, and conductive pad 210. Laser landing area 204 contains mating surfaces 224 and 226.

FIG. 14 illustrates the placement of laser 100 into PIC substrate 200 in a pre-aligned configuration. In FIG. 14, laser 100 is initially placed so that mating surfaces 112 and 114 are at a distance far from contacting mating surfaces 224 and 226 of PIC substrate 200. At this stage, side surfaces 110 should be in direct contact with front side walls 206 and 208, as well as back side walls 210 and 212. A portion of each of side surfaces 110 will be above the gaps 214. In this configuration, electroplated gold surface will be in contact with solder 222. However, the leading edge of the electroplated gold surface will be substantially at a distance from the front of the solder 222.

Figure 16:
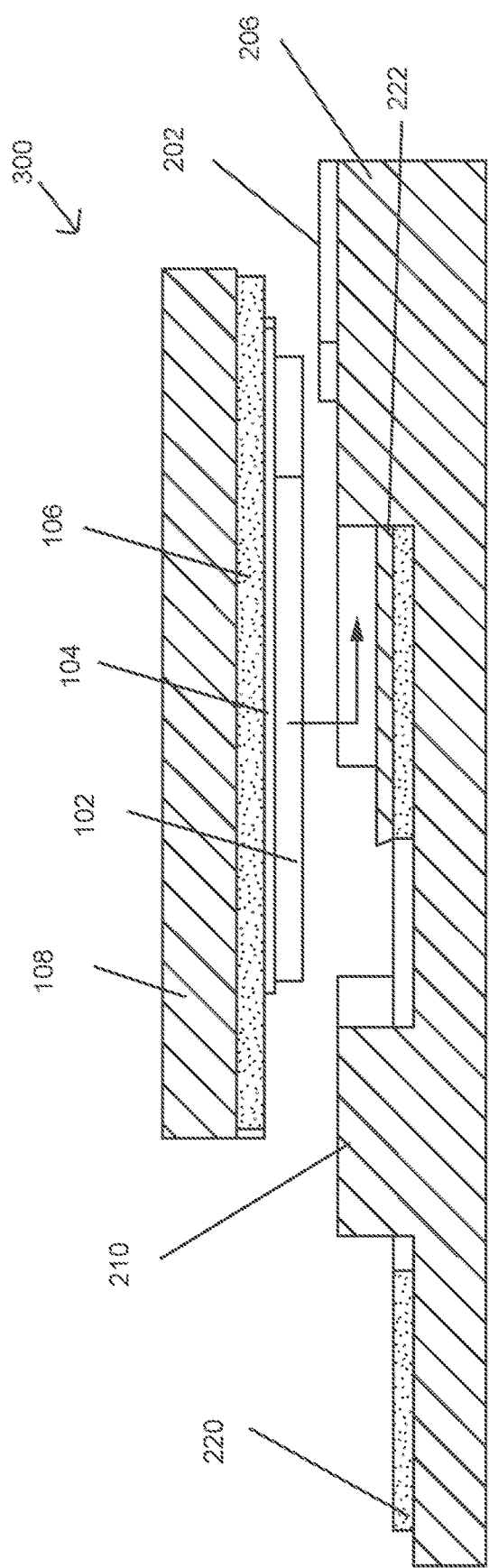
FIG. 16 shows a cross-sectional view of a semiconductor laser and PIC in accordance with an embodiment of the present disclosure.

Referring to FIG. 15, a cross-sectional view of a semiconductor laser and PIC in accordance with an embodiment of the present disclosure is shown. In particular, FIG. 15 shows the C-C' cross section illustrated in FIG. 7. FIG. 15 particularly shows this cross-section when the laser is in the configuration shown in FIG. 4. In FIG. 15, PIC assembly 300 contains semiconductor laser 100 and PIC substrate 200. FIG. 15 illustrates the alignment of laser 100 into PIC substrate 200. In FIG. 15, the laser 100 in FIG. 14 is pushed forward so that mating surfaces 112 and 114 are firmly contacting mating surfaces 224 and 226 of PIC substrate 200. At this stage, side surfaces 110 should be in direct contact with front side walls 206 and 208, as well as back side walls 210 and 212. A portion of each of side surfaces 110 will be above the gaps 214; however, this portion will be different from the portion that was above the gaps in FIG. 14. In this configuration, electroplated gold surface will be in contact with solder 222, and the leading edge of the electroplated gold surface will be substantially aligned with the front edge of the solder 222. Referring to FIG. 16, a cross-sectional view of a semiconductor laser and PIC in accordance with an embodiment of the present disclosure is shown. In particular, FIG. 16 shows the D-D' cross section illustrated in FIG. 7. FIG. 16 particularly shows this cross-section when the laser is in the configuration shown in FIG. 2. In FIG. 16, laser 100 contains electroplated gold surface 102, conductive layer 104, lower mating surface region 106, upper region 108, and side surfaces 110. Lower mating surface region 106 contains mating surfaces 112 and 114, and laser facet 116. In addition, PIC substrate 200 contains waveguide 202, laser landing area 204, side walls 206 and 208, and conductive pad 210. Laser landing area 204 contains mating surfaces 224 and 226.

FIG. 16 illustrates the placement of laser 100 into PIC substrate 200 in a pre-aligned configuration. In FIG. 16, laser 100 is initially placed so that mating surfaces 112 and 114 are at a distance far from contacting mating surfaces 224 and 226 of PIC substrate 200. At this stage, side surfaces 110 should be in direct contact with front side walls 206 and 208, as well as back side walls 210 and 212. A portion of each of side surfaces 110 will be above the gaps 214. In this configuration, electroplated gold surface will be in contact with solder 222. However, the leading edge of the electroplated gold surface will be substantially at a distance from the front of the solder 222.

Figure 17:
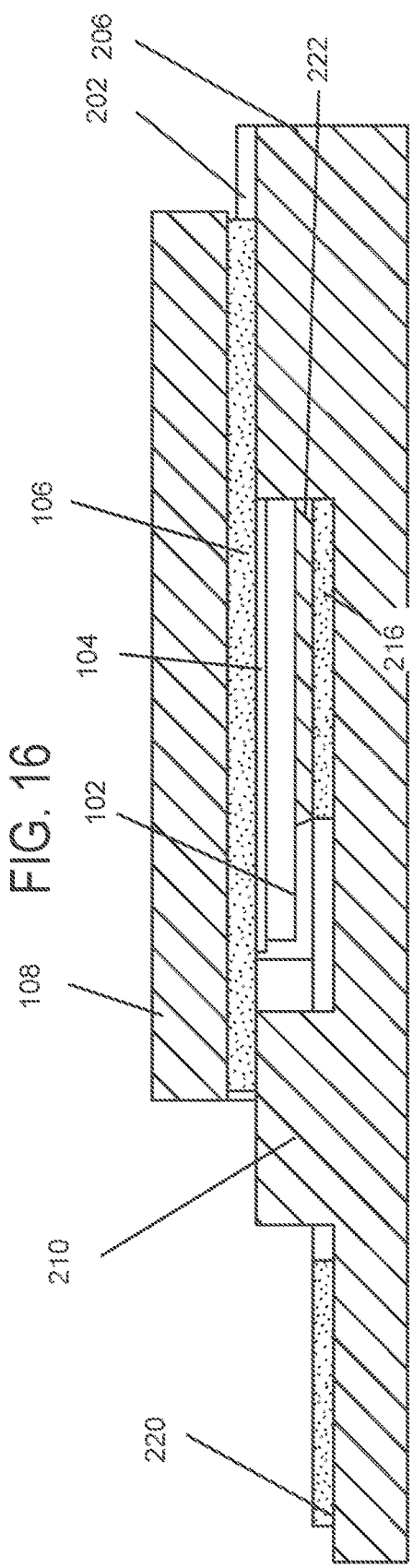
FIG. 17 shows a cross-sectional view of a semiconductor laser and PIC in accordance with an embodiment of the present disclosure.
Figure 18:
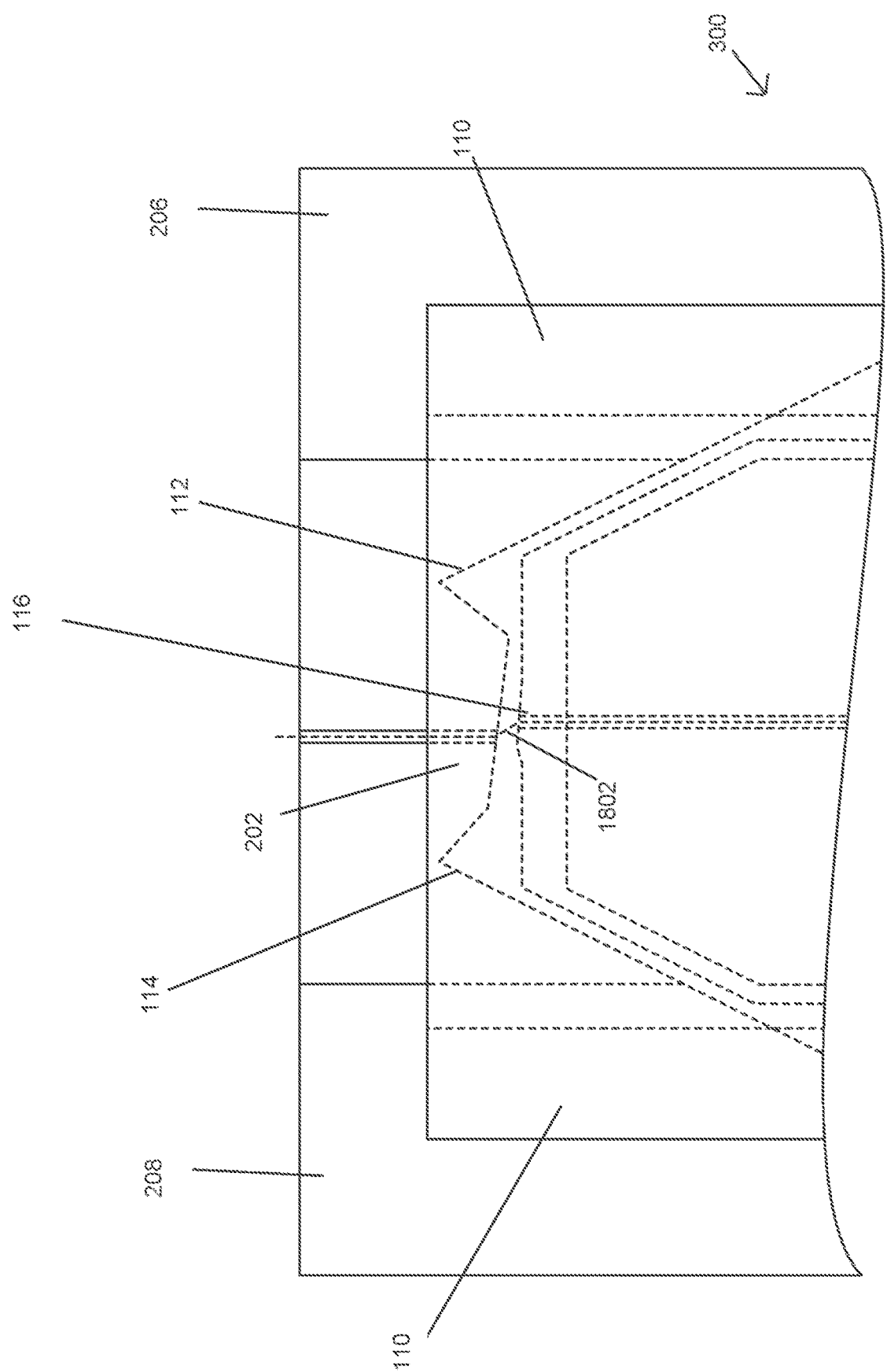
FIG. 18 shows a top-down view of a semiconductor laser and PIC in accordance with an embodiment of the present disclosure.

Referring to FIG. 17, a cross-sectional view of a semiconductor laser and PIC in accordance with an embodiment of the present disclosure is shown. In particular, FIG. 17 shows the D-D' cross section illustrated in FIG. 7. FIG. 17 particularly shows this cross-section when the laser is in the configuration shown in FIG. 4. In FIG. 17, PIC assembly 300 contains semiconductor laser 100 and PIC substrate 200. FIG. 17 illustrates the alignment of laser 100 into PIC substrate 200. In FIG. 17, the laser 100 in FIG. 14 is pushed forward so that mating surfaces 112 and 114 are firmly contacting mating surfaces 224 and 226 of PIC substrate 200. At this stage, side surfaces 110 should be in direct contact with front side walls 206 and 208, as well as back side walls 210 and 212. A portion of each of side surfaces 110 will be above the gaps 214; however, this portion will be different from the portion that was above the gaps in FIG. 14. In this configuration, electroplated gold surface will be in contact with solder 222, and the leading edge of the electroplated gold surface will be substantially aligned with the front edge of the solder 222. Referring to FIG. 18, a top-down view of a semiconductor laser and PIC in accordance with an alternate embodiment of the present disclosure. In FIG. 18, laser 100 contains electroplated gold surface 102, conductive layer 104, lower mating surface region 106, upper region 108, and side surfaces 110. Lower mating surface region 106 contains mating surfaces 112 and 114, and laser facet 116. In addition, PIC substrate 200 contains waveguide 202, laser landing area 204, side walls 206 and 208, and conductive pad 210. Laser landing area 204 contains mating surfaces 224 and 226.

FIG. 18 presents a top-down view of the configuration of laser 100 and PIC substrate 200 shown in FIG. 3 with a modification to the laser facet 116 and waveguide 202. In FIGS. 3 and 9, laser facet 116 is etched so that it is straight along the horizontal and vertical axes of the device. However, as shown in FIG. 11, the laser facet 116 can be etched so that is angled in the vertical direction. In conventional semiconductor lasers, the laser facet 116 is formed by cleaving the material that forms the laser to generate an edge, but this is a very imprecise process. This cleaving process can form an imprecise vertical angle along the facet of the laser, but the angle cannot be controlled as is shown in the configuration of FIG. 11.

In particular, in the laser of the present disclosure, the laser facet 116 is not formed by cleaving, but rather it is etched out of the laser device. The etching process allows a high degree of accuracy in forming the edge of the facet 116. This etching allows precise control of the shape of the leading edge of the facet 116 not only in the vertical direction, but also in the horizontal direction. Thus, in FIG. 18, the laser facet 116 shown is not etched in a straight line along the horizontal axis, but rather it is etched at a precisely controlled angle with respect to the horizontal axis, as shown. Because the laser facet is not a straight line, the laser light will exit the facet an angle, as shown by laser light 1802. This laser light will enter the waveguide at a horizontal offset distance 1802 from the facet 116. The front surface of waveguide 202 will also be generated at an angle, as shown. Preferably, this angle is approximately three times the angle of the laser facet (determined by the refractive index of the materials), although many other angle ratios can be used. In addition, the waveguide front surface is preferably angled in the same direction as the laser facet. By generating an angled facet and placing the waveguide at an offset from the facet, undesirable back reflection of the laser light into the laser can be avoided.

FIG. 19 presents a top-down view of the configuration of laser 100 and PIC substrate 200 shown in FIG. 3 with a modification to the mating surfaces 112 and 114 of laser 100. Fabrication of the sharp corners of the mating surfaces 112 and 114 shown in FIG. 1 is difficult due to technical concerns regarding the ability of the fabrication machine to resolve small patterning details. As an alternative to the sharp corners shown in FIG. 1, FIG. 19 presents a laser device in which mating surfaces 112 and 114 have been clipped to form the configuration shown. In this way, the mating surfaces 112 and 114 do not form a sharp point at their ends, but rather contain a flat surface along the leading edge of the mating surface. In this configuration, some relief is provided so that the front edge of the mating surfaces 112 and 114 will not contact mating surfaces 224 and 226. Rather, in this embodiment, mating surfaces 112 and 114 will contact mating surfaces 224 and 226 at some distance behind the front of edge of the pattern, forming holes 1902 and 1904 as shown. This innovative design advantageously provides relief from the direct contact that allows extremely accurate self-alignment of the laser device even in the presence of patterning defects in laser 100 and PIC substrate 200.

FIG. 20 presents a top-down view of the configuration of laser 100 and PIC substrate 200 shown in FIG. 3 with a modification to the mating surfaces 224 and 226. Fabrication of the sharp corners of the mating surfaces 224 and 226 shown in FIG. 2 is difficult due to technical concerns regarding the ability of the fabrication machine to resolve small patterning details. As an alternative to the sharp corners shown in FIG. 2, FIG. 20 presents a laser device in which mating surfaces 224 and 226 have been designed to form a square like configuration as shown. In this way, the mating surfaces 224 and 226 do not form a sharp point at their ends, but rather contain form a box like structure. In this configuration, some relief is provided so that the front edge of the mating surfaces 112 and 114 will not directly contact mating surfaces 224 and 226. Rather, in this embodiment, mating surfaces 112 and 114 will contact mating surfaces 224 and 226 at some distance behind the front of edge of the pattern of mating surfaces 224 and 226, forming holes 2002 and 2004 as shown. Like the configuration in FIG. 19, this configuration provides an innovative design that advantageously provides relief from the direct contact that allows extremely accurate self-alignment of the laser device even in the presence of patterning defects in laser 100 and PIC substrate 200.

FIG. 21 presents a top-down view of the configuration of laser 100 and PIC substrate 200 shown in FIG. 3 with a modification to the mating surfaces 224 and 226 different from the modification of FIG. 20. In FIG. 21, the edges 2102 and 2014 of mating surfaces 224 and 226 form a curve, as shown. The curvature of these edges provides a unique configuration in which, when the laser slide along the wall into alignment, a different portion of the lower mating surface 106 of laser 100 will contact the side wall along the way. In this manner, damage to the laser device can be minimized during alignment by distributing the force exerted on the laser device 100. Like the configurations in FIGS. 19 and 20, this configuration also advantageously provides relief from the direct contact that allows extremely accurate self-alignment of the laser device even in the presence of patterning defects in laser 100 and PIC substrate 200.

The surfaces of parts to be mated that come into mutual contact may be shaped to eliminate contact at a sharp point during alignment. For example, consider that a substrate, such as substrate 200, for example, has a substrate mating surface that is flat. A part, such as laser 100, for example, may have a laser mating surface that mates with the flat substrate mating surface. Thus, the laser mating surface may be shaped to eliminate sharp point contact(s) with the substrate mating surface. The laser mating surface, for example, may be shaped to have a smooth sliding surface such that the laser mating surface and substrate mating surface are tangential to one another while in contact. The substrate mating surface may also be shaped to eliminate sharp point contact(s), and may be shaped to similarly to have a smooth sliding surface such that the laser mating surface and substrate mating surface are tangential to one another while in contact.

Moreover, to minimize the erosion or pitting of these surfaces during the action of sliding, laser and/or substrate mating surfaces may be shaped such that a location of tangential contact moves in a continuous or noncontiguous manner along one or both of the mating surfaces so that a location of contact smoothly moves to a front mating region during alignment. During alignment, a location of contact may move closer to a front final engagement position as alignment proceeds. This movement of location may help provide that erosion or debris created through friction during alignment do not interfere with ongoing alignment and remain in open areas to the rear of the contact area.

Mating surfaces of a substrate, such as substrate 200, for example, and/or a part, such as laser 100, for example, may be shaped such that alignment error is reduced during the alignment process. The mating surfaces may be shaped by tapering curved and/or straight surfaces such that alignment error tolerance is reduced. The shaping of mating surfaces may be provided by lithographic or other shaping processes. Alignment error tolerance may be reduced to necessary values by such shaping. For example, when an imperfectly aligned part is first brought into contact with a substrate, the maximum positioning error may be as much as 10 to 25 microns. However, alignment proceeds, the part may be moved laterally and/or longitudinally according a taper rate provided by one or more tapered mating surfaces located on the part and/or substrate. This movement may reduce lateral positioning error as the longitudinal distance is reduced, all the while smoothly moving the part (and associated contacts) closer to a final mating location. The positioning error may reduce below 10 microns, below 2 microns, and finally below 1 micron, for example, as the part is moved closer to its final mating location.

Figure 22:
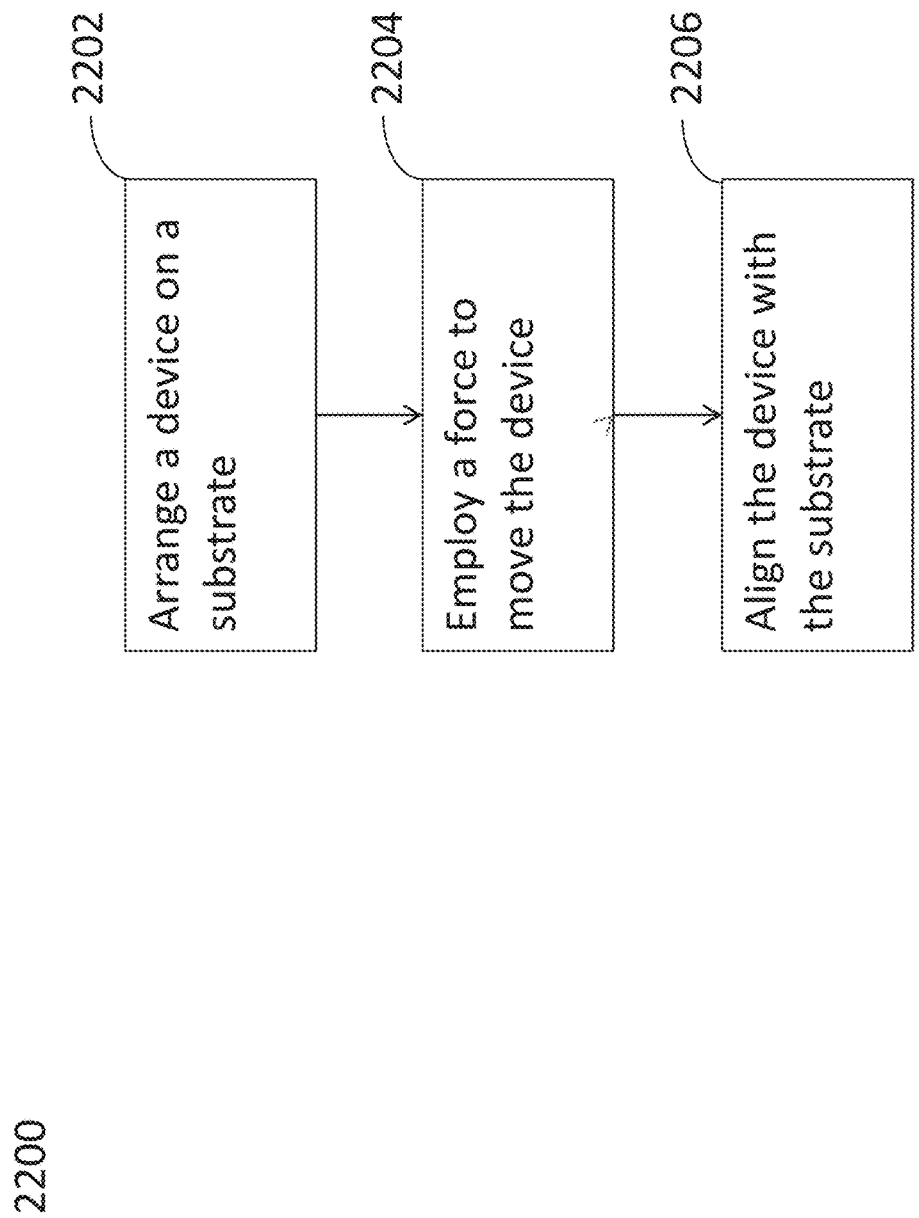
FIG. 22 shows a method of fabricating a PIC arrangement in accordance with an embodiment of the present disclosure.

FIG. 22 shows a method 2200 of fabricating a PIC arrangement, such as PIC 300. At step 2202, a device is arranged on a substrate. The device may be semiconductor laser 100 or a different device, such as a different kind of laser, a filter, modulator, amplifier, imager, or memory chip, for example. The substrate may be PIC substrate 200. Similar to as discussed above in regard to FIG. 3, the device can be placed on the substrate by a placement assembly that can place the device without damaging it, such as a suction cup assembly. At step 2204, a force may be used to move the device on the substrate. The force may be an external force as described above or a passive force as described above. At step 2206, the device may be aligned with the substrate as a result of the external or passive force. Alignment may be performed as described above.

Figure 23:
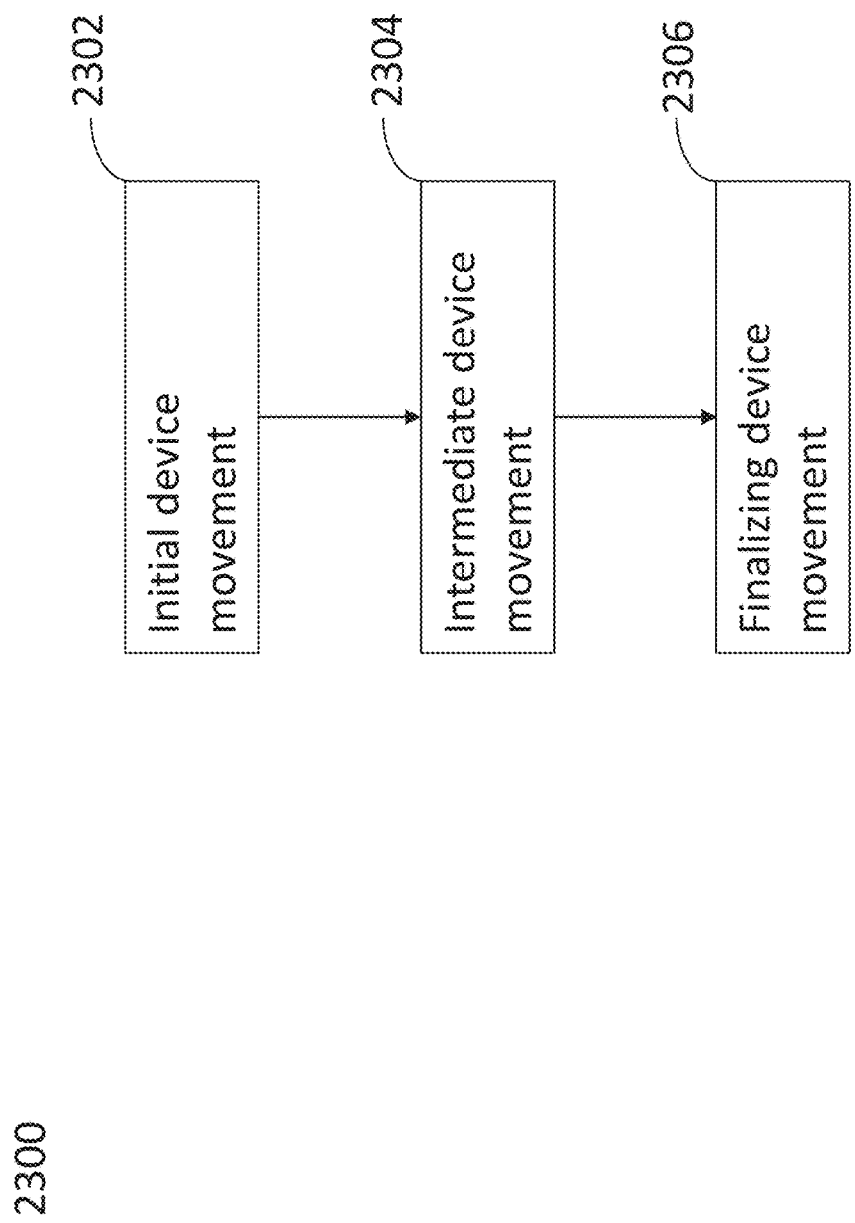
FIG. 23 shows an exemplary engagement method of aligning a device on a substrate in accordance with an embodiment of the present disclosure.

FIG. 23 shows an exemplary engagement method 2300 of aligning a device on a substrate. The method 2300 may be employed by any of the alignment procedures previously discussed above. After a device has been placed on a substrate, method 2300 may begin. At step 2302, the device is initially moved. The initial movement may be of a higher speed relative to the other movements in engagement method 2300, and is provided to initially align the device on the substrate. At step 2304, an intermediate movement is device is performed. This movement is a finer movement relative to the movement of step 2302, and carefully aligns mating surfaces of the device with surfaces of the substrate. At step 2306, finalizing device movement is performed. The finalizing device movement is the most precise movement of the device relative to the movements in steps 2302 and 2304, and is used to engage a front facet of the device laterally and vertically with the substrate, and ensure that the features of the device are accurately fitted with the substrate. The movements of steps 2302, 2304, and 2306 may be caused by external force or passive force.

Figure 24:
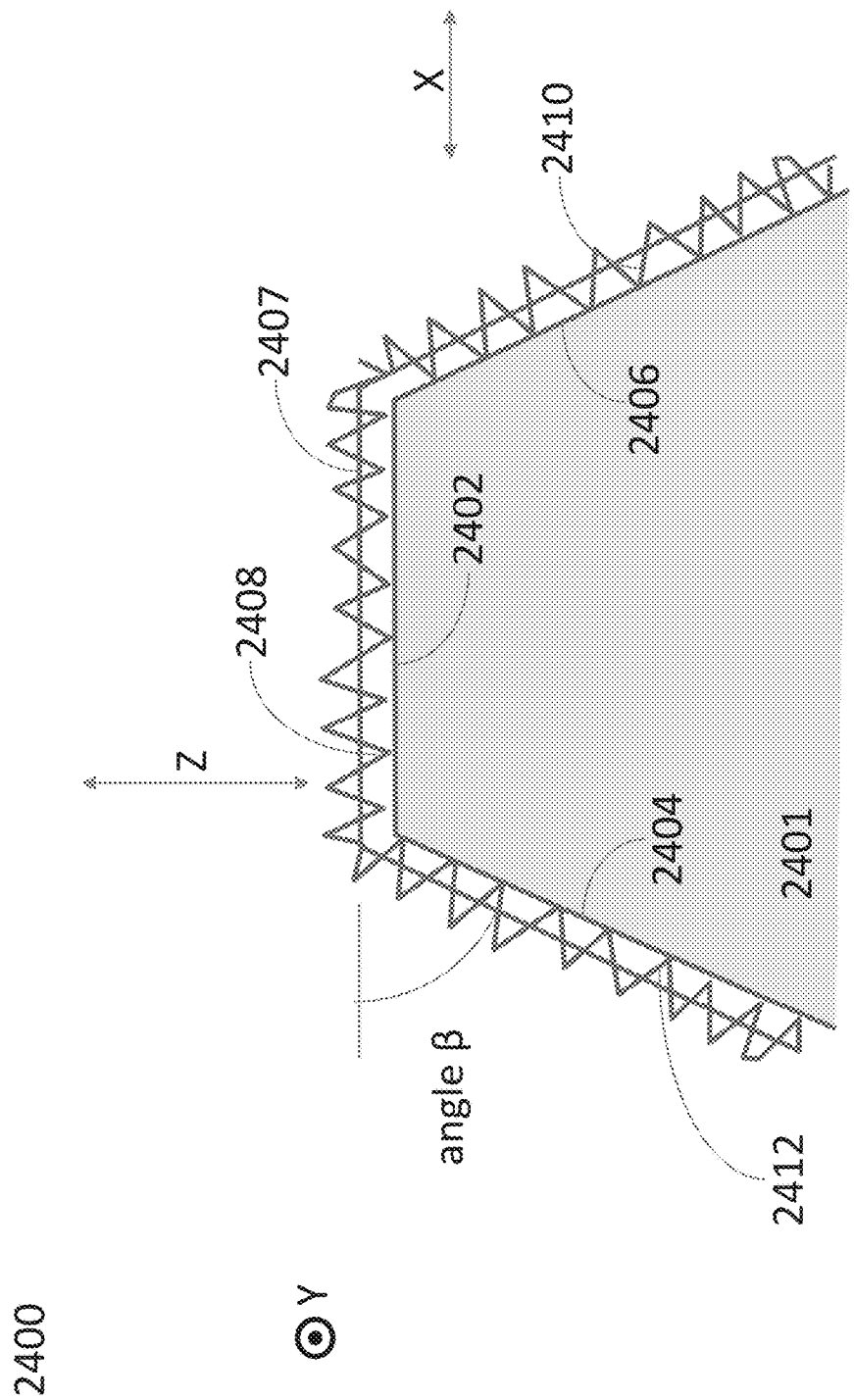
FIG. 24 shows a diagram of an exemplary alignment of a device with a substrate in accordance with an embodiment of the present disclosure.

FIG. 24 is a diagram 2400 that shows an exemplary alignment of device 2401 with substrate 2407. Device 2401 may be laser 100 or any of the other devices previously discussed. Substrate 2407 may be substrate 200 or any other substrate that receives one or more of the devices discussed in the present disclosure. In the example of FIG. 24(a), device 2401 has mating surfaces 2402, 2404, and 2406. The mating surfaces are shown in FIG. 24(a) as having minimal or no roughness, but alternatively may have a rough surface. Substrate 2407 has substrate mating surfaces 2408, 2410, and 2412. The substrate mating surfaces as shown in FIG. 24(a) have rough surfaces as indicated by the jagged lines, but may alternatively have minimal or no roughness. As indicated in FIG. 24(a), the X direction is horizontal relative to the perspective view of the figure. The Z direction is vertical relative to the perspective view of the figure and the Y direction is coming out of the page relative to the perspective view of the figure.

To align device 2401 with substrate 2407, the average roughness of the device and substrate mating surfaces, as well as the angles of the mating surfaces to each other determines a positional accuracy (or error) of the mated assembly. The angle Beta ($\beta$) is an angle of a mating surface of substrate 2407, such as surface 2412, relative to a normal surface of substrate 2407, such as surface 2408. Choosing an angle $\beta$ has implications on the angular error tolerance of aligning device 2401 and substrate 2407.

For example, $\beta$ may equal 45 degrees. A $\beta$ of 45 degrees indicates that for successful alignment of device 2401 with substrate 2407, the allowable error in the Z direction is equal to the allowable error in the X direction. Thus, in such a case, alignment of device 2401 with substrate 2407 has the same error tolerance in the X and Z directions.

In another example, $\beta$ may be greater than 45 degrees. In this example, for successful alignment of device 2401 with substrate 2407, the allowable error in the X direction must be less than the allowable error in the Z direction. Thus, in this example, the error tolerance in the Z direction is higher relative to the error tolerance in the X direction.

In a further example, $\beta$ may be less than 45 degrees. In this example, for successful alignment of device 2401 with substrate 2407, the allowable error in the Z direction must be less than the allowable error in the X direction. Thus, in this example, the error tolerance in the X direction is higher relative to the error tolerance in the Z direction.

In some embodiments, the allowable error tolerance may correspond to ratios of the X and Z directions. In one example, an allowable error ratio of M:1 may be provided for a directional ratio of Z:X, and $\beta$ may therefore equal the arctangent of M. Thus, in this example, an angular error tolerance in the Z direction may be twice the angular error tolerance in the X direction, and M may be equal to 2. In such a case, the optimum angle of $\beta$ is equal to the arctangent of 2.

Figure 25A:
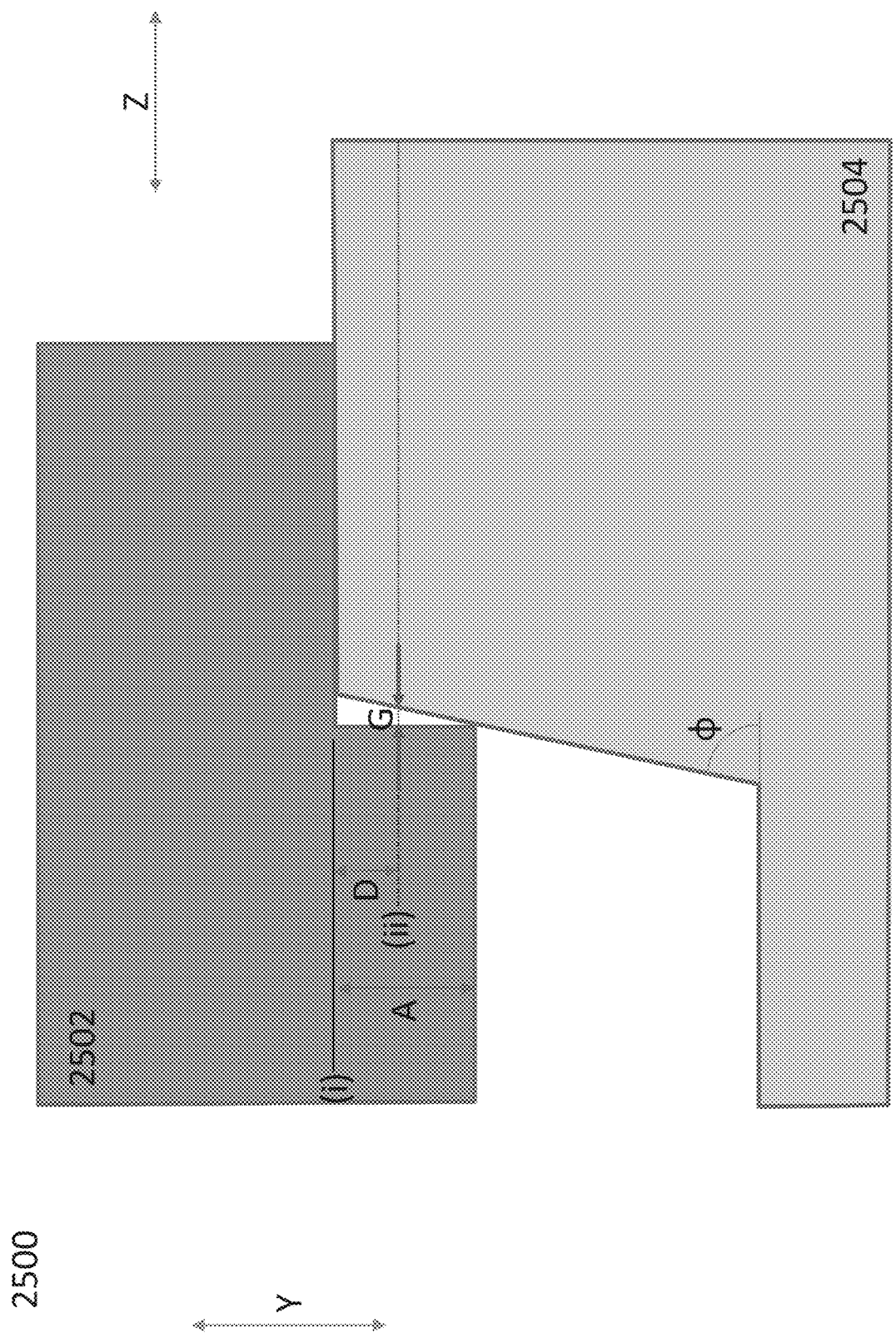
FIG. 25(a) shows a diagram of a further exemplary alignment of a device with a substrate in accordance with an embodiment of the present disclosure.

FIG. 25(a) is a diagram 2500 that shows a further example alignment of a device with a substrate. A device 2502 must be aligned with substrate 2504. Device 2502 may be laser 100 or any of the other devices previously discussed. Substrate 2504 may be substrate 200 or any other substrate that receives one or more of the devices discussed in the present disclosure.

Device 2502 has several parameters that must be accounted for in its design, including parameters A, D, G, and angle phi (ϕ). Parameter A is the step height of device 2502, measured from a step origination plane (i) indicated in FIG. 25(*a*). Parameter D is the height measured from step original plane (i) to facet plane (ii). Facet plane (ii) indicates the location of a facet in device 2502, such as laser facet 116. Parameter G is the gap between device 2502 and substrate 2504 at the center of the active region of a laser facet, such as laser facet 116. The active region of the laser is described below. Angle phi (ϕ) is a vertical angle of a surface of substrate 2504 that contacts the step of device 2502.

By increasing step height A, G also increases. Increasing G, however, can decrease performance when device 2502 is attached to substrate 2504, because too large of a gap between device 2502 and substrate 2504 can introduce back reflection, increase the likelihood of interference, and introduce other erroneous components. Parameter D, however, can be increased to alleviate this issue. By increasing parameter D, the center of the active region at the facet would be located further away from plane (i) in device 2502 and closer to substrate 2504, minimizing G. Care must be taken, however to ensure that an increased D does not make the step height A too large, as this may introduce stack-up error into device 2502 and cause alignment issues.

G may also be minimized by minimizing the height step A and increasing the angle phi (ϕ). Making these adjustments brings the center of the active region at the facet closer to substrate 2504 and minimizes G, and therefore may improve the optical coupling of the device 2502 to substrate 2504. However, making step height A too small can cause fabrication issues such as causing device 2502 to skip over substrate 2504 due to a lack of contact between the step of 2502 and substrate 2504. Thus, parameters A, D, G, and ϕ must be carefully chosen.

Figure 25B:
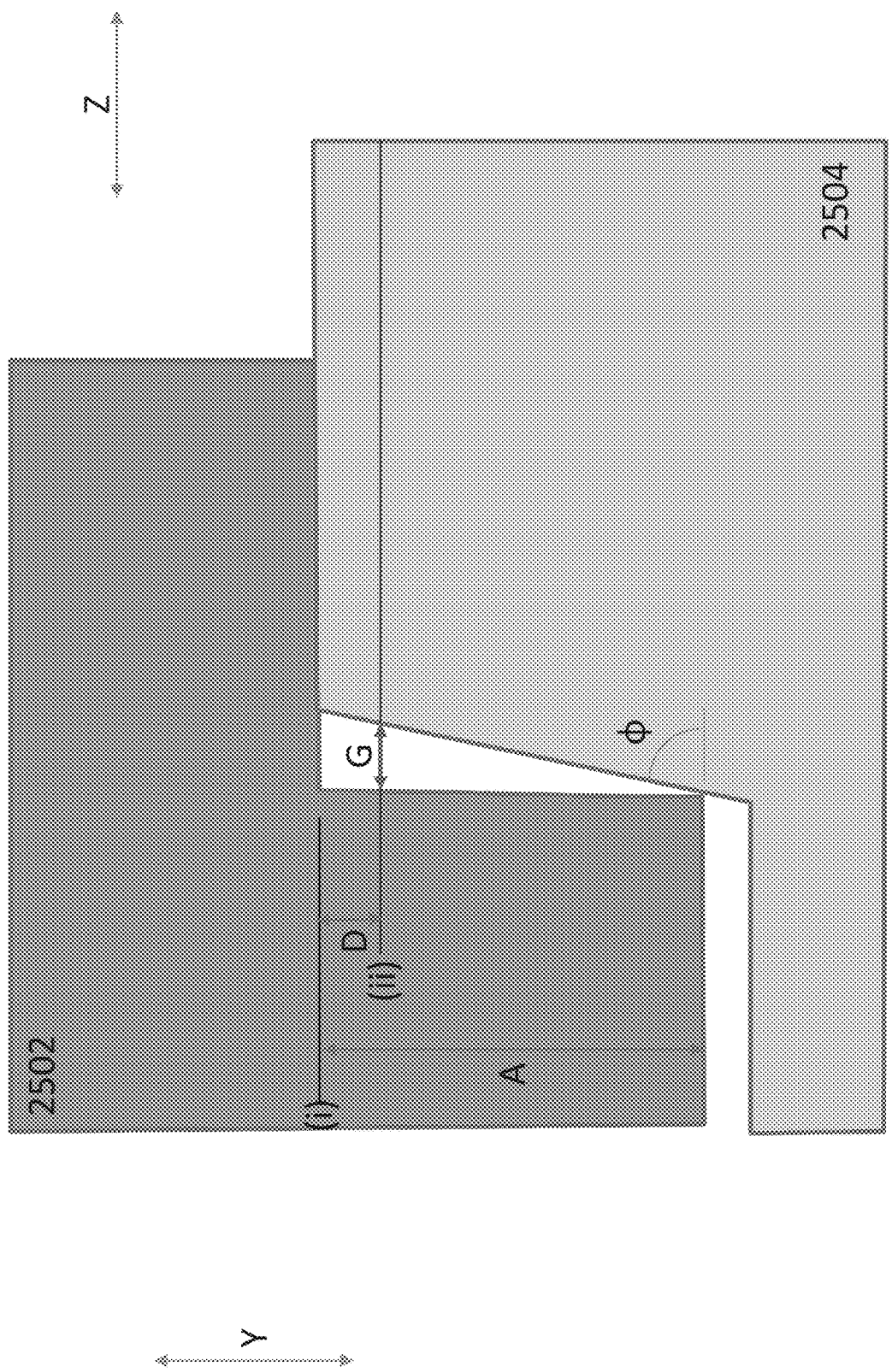
FIG. 25(b) shows a diagram of another exemplary alignment of a device with a substrate in accordance with an embodiment of the present disclosure.

FIG. 25(*b*) shows a diagram 2506 of the example discussed above where a step height A is increased in regard to device 2502 and substrate 2504. As shown in FIG. 25(*b*), increasing A in turn increases G, and such an increase of G may introduce back reflection, increase the likelihood of interference, and introduce other erroneous components.

As discussed above, minimizing height A may improve optical coupling of device 2502 to substrate 2504. Height A, however, also provides cladding thickness for device 2502, and if this height is thinned too much, optical performance of device 2502 can suffer. For example, device 2502 may be a InP based semiconductor laser. Such semiconductor lasers may be used to provide laser light to silicon photonic circuits, and emit light in a range that is transparent to silicon. Therefore, silicon can be used as a high index material as part of waveguide formations in the silicon photonic circuits.

InP based lasers, which may be a laser of the type depicted in FIG. 1, may be fabricated from InGaAsP or InGaAlAs active regions, with claddings made of InP, and may have a semiconductor contact layer that is made from highly p-doped InGaAs, all deposited epitaxially on an n-type InP substrate. A metallization to the highly p-doped InGaAs can be Ti, Pt, and Au, for example. The metallization may form a metallic contact layer that is a contact surface that forms an electrical connection with a substrate. The metallic contact layer may include at least one electrodes. For example, the metallic contact layer may include two electrodes. The two electrodes may be located on a same surface. One of the electrodes may correspond to a p-contact of the laser, and another of the electrodes may correspond to an re-contact of the laser, as is discussed below. The semiconductor contact layer may be located above an upper cladding layer. These layers may be deposited by electron beam evaporation. Au may also be deposited using electroplating. These metals as well as the InGaAs layer can have loss at wavelengths at which the laser operates and as such, the upper cladding layer (e.g., included in height A and A-D) may be made sufficiently thick to avoid optical loss due to these layers to the laser mode. The thickness of the upper cladding layer can be configured to keep optical loss caused by absorption equal to or below about 0.3/cm. Keeping optical loss equal to or below about 0.3/cm helps ensure that laser efficiency is not detrimentally impacted. This optical loss may be caused by absorption due to the semiconductor contact layer and/or the metallic contact layer.

Figure 26:
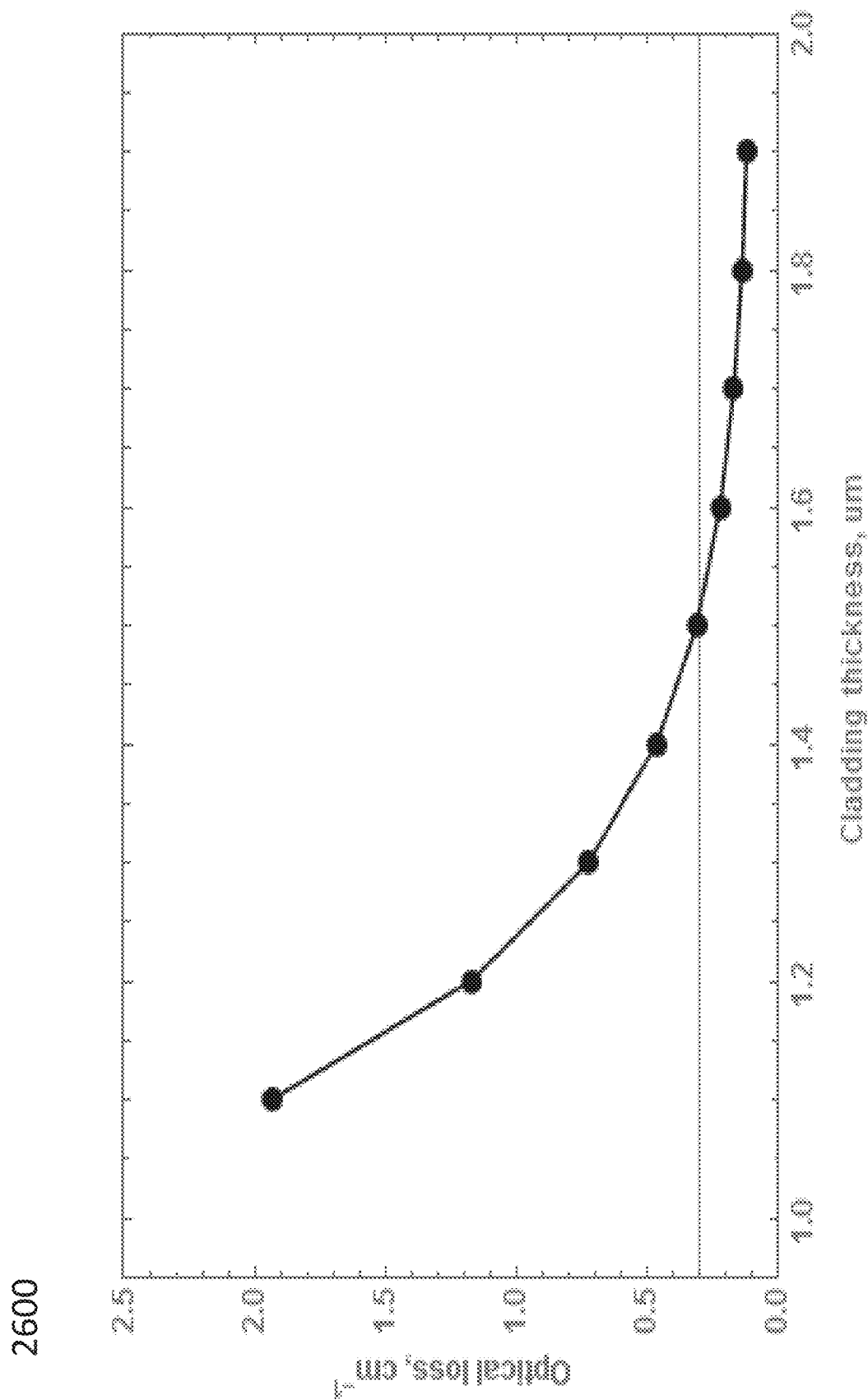
FIG. 26 shows exemplary calculated optical loss as a function of upper cladding thickness for an exemplary laser epitaxial structure configured to emit 1310 nm.

In one example, a laser epitaxial structure may be configured to emit 1310 nm. Using deposition techniques such as Metalorganic Chemical Vapor Deposition (MOCVD) or Molecular Beam Epitaxy (MBE) for example, the following layers can be epitaxially deposited on an n-type InP substrate: an n-type InP lower cladding layer (the lower cladding may extend into the substrate); an undoped active region; a p-doped InP upper cladding layer; and a highly p-doped InGaAs contact layer. The active region may be formed with InAlGaAs-based compressively strained quantum wells and InAlGaAs-based tensile strained barriers, sandwiched by AlGaInAs graded layers. The active region may be sandwiched between the upper and lower cladding layers. The structure may also have a wet etch stop layer to aid the fabrication of a ridge laser. The structure may also contain a grating layer that is patterned with holographic lithography or e-beam lithography to allow the formation of a distributed feedback (DFB) laser. FIG. 26 shows exemplary calculated optical loss as a function of upper cladding thickness for an exemplary laser epitaxial structure configured to emit 1310 nm in graph 2600. Optical loss can be attributed to the highly p-doped InGaAs and the metal layers. In this example, the exemplary laser operates efficiently when the optical loss is equal to or less than 0.3 cm$^{-1}$. As shown by FIG. 26, optical loss decreases as the cladding thickness increases, and it is desirable to have an upper cladding layer thickness of at least 1.5 μm to keep the laser efficient, for this example.

An n-contact to the laser can be on the back of the InP substrate or on top surface of the semiconductor. Placing n- and p-contacts or electrodes on top of the top surface of the semiconductor laser 100 allows both electrical contacts to be made between the laser chip and the PIC substrate during the attachment process.

Figure 27:
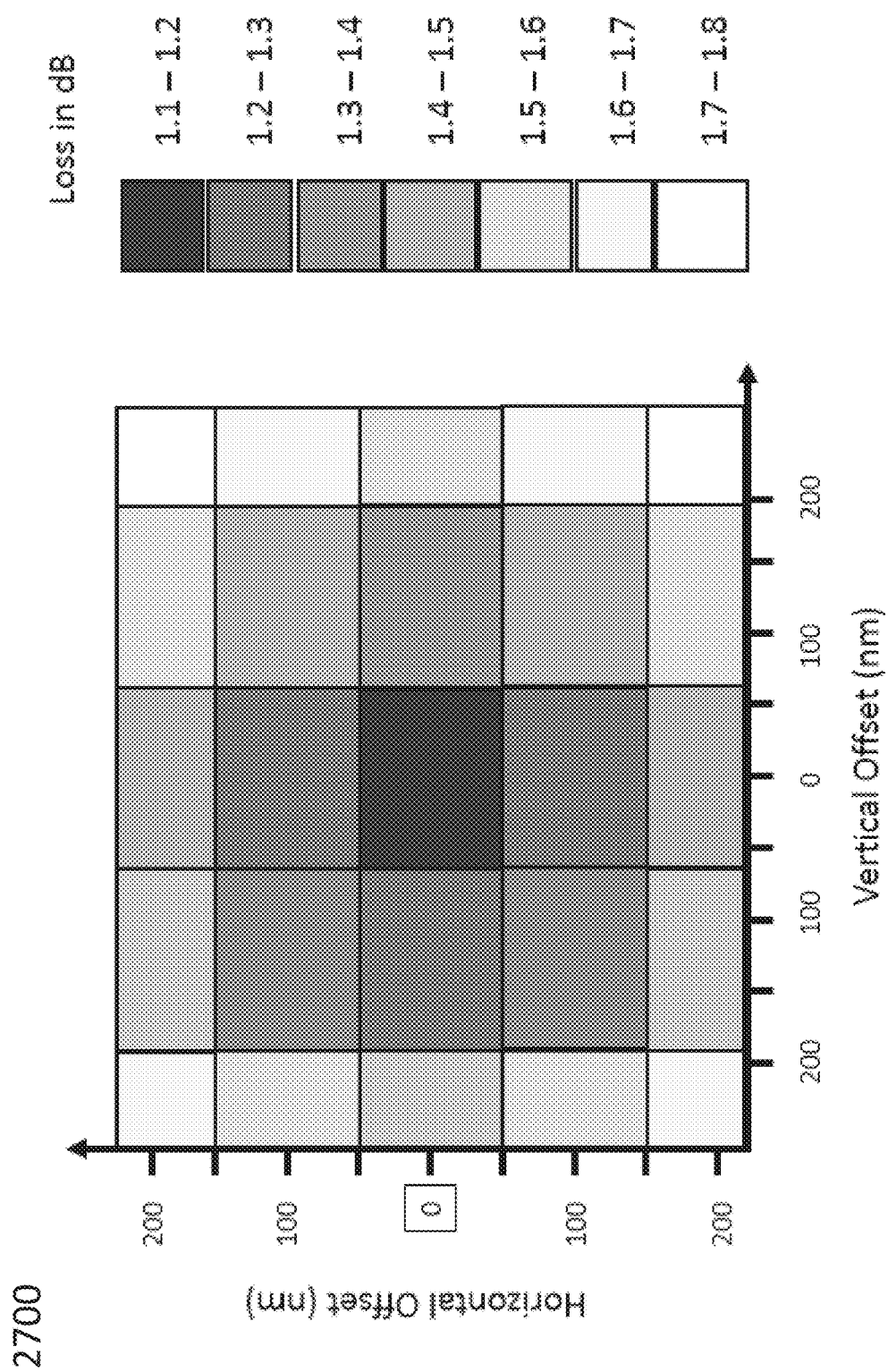
FIG. 27 shows an exemplary Finite Difference Time Domain (FDTD) graph of alignment tolerance.

FIG. 27 shows a Finite Difference Time Domain (FDTD) graph 2700 of alignment tolerance required to achieve minimal coupling losses for a laser 100 to the interface of PIC substrate 200. The graph shows the expected coupling losses as a function of horizontal and vertical offsets for laser 100 relative to the interface of PIC substrate 200. The horizontal and vertical offsets of alignment are shown in nanometers (nm). The coupling loss is shown in decibels (dB). As shown by the graph, when the horizontal offset up to 50 nm and the vertical offset is up to 60 nm, the coupling loss in dB is minimized. As the offset is increased in both the vertical and horizontal directions, the coupling loss increases.

In sum, the present disclosure introduces a new paradigm of cost-effective precision assembly in the form new passive assembly techniques with enabling structures. These techniques allow for self-alignment and precision self-assembly. With "self-aligned" parts, a combination of precision surfaces and features are used in parts to be mated together, and a mechanical guiding function using an additional simple one-dimensional limited motion control is used to lock the mated parts together precisely in three dimensions aligned in six degrees of orientation. These techniques achieve better positional tolerances than in current methods, with speeds comparable to simple "as-is" passive assembly techniques. With precision self-assembly, the same innovative precision surfaces and geometrical features as described above may be used with the added feature that the parts move together into final position by themselves without external mechanical assistance, such as by thermal cycling, differential expansions, vibration, vacuum and other physical effects. These techniques have the potential to revolutionize the industry by achieving ultra-high assembly precision at very low costs points.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of at least one particular implementation in at least one particular environment for at least one particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

The invention claimed is:

1. A photonic integrated circuit (PIC), comprising:
   a semiconductor laser comprising a laser mating surface and a contact surface, the laser mating surface comprising a tapered laser mating surface and a laser facet, the laser facet being completely set back to a position between where the tapered laser mating surface is narrower and the tapered laser mating surface is wider; and
   a substrate comprising a tapered substrate mating surface and a recessed landing area formed in the substrate, wherein the tapered substrate mating surface is configured to contact the tapered laser mating surface of the semiconductor laser, and wherein the recessed landing area comprises a contact pad configured to form an electrical connection with the contact surface of the semiconductor laser.

2. The PIC of claim 1, wherein a shape of the tapered laser mating surface and a shape of the tapered substrate mating surface are configured to align the semiconductor laser with the substrate when an external force is applied to the semiconductor laser.

3. The PIC of claim 2, wherein an edge of the tapered laser mating surface is configured to contact the tapered substrate mating surface when the semiconductor laser is aligned with the substrate.

4. The PIC of claim 3, wherein a rear wall of the substrate is configured to contact a back portion of the semiconductor laser and a side wall of the substrate is configured to contact a side surface of the semiconductor laser when the semiconductor laser is aligned with the substrate.

5. The PIC of claim 4, wherein a portion of the side surface of the semiconductor laser is configured to be located above a gap portion of the substrate when the semiconductor laser is aligned with the substrate.

6. The PIC of claim 1, wherein a first edge of the tapered laser mating surface contacts the tapered substrate mating surface, and a second edge of the tapered laser mating surface does not contact the tapered substrate mating surface.

7. The PIC of claim 1, wherein the tapered substrate mating surface includes a curved edge, wherein the curved edge is configured to distribute an external force applied to the semiconductor laser during an alignment of the semiconductor laser with the substrate.

8. The PIC of claim 1, further comprising:
   a waveguide formed on the substrate, wherein the waveguide is configured to receive a laser beam that exits the laser facet.

9. The PIC of claim 8, wherein the laser facet is angled and a leading edge of the waveguide is angled, and wherein the angle of the laser facet and the angle of the leading edge of the waveguide are configured to reduce a back reflection of the laser beam from the waveguide into the laser facet.

10. The PIC of claim 9, wherein the laser facet and the leading edge of the waveguide are angled in the same direction.

11. The PIC of claim 1, wherein solder is located between the contact pad and the contact surface of the semiconductor laser.

12. The PIC of claim 1, wherein the recessed landing area further comprises:
   a solder layer located on the contact pad; and
   a run-off area configured to receive solder from the solder layer located on the contact pad.

13. The PIC of claim 12, wherein the run-off area is configured to receive solder by drawing the solder from the solder layer away from the contact pad.

14. A method of fabricating a photonic integrated circuit (PIC), the method comprising:
   arranging a semiconductor laser on a substrate, wherein the semiconductor laser comprises a laser mating surface and a contact surface, the laser mating surface comprising a tapered laser mating surface and a laser facet, the laser facet being completely set back to a position between where the tapered laser mating surface is narrower and the tapered laser mating surface is wider, wherein:
      the substrate comprises a tapered substrate mating surface formed in the substrate and a recessed landing area;
      the tapered laser mating surface is configured to contact the tapered substrate mating surface; and
      the recessed landing area comprises a contact pad configured to form an electrical connection with the contact surface of the semiconductor laser; and
   aligning the semiconductor laser with the substrate using a shape of the laser mating surface and a shape of the substrate mating surface.

15. The method of claim 14, further comprising:
   applying an external force to the semiconductor laser in a direction from the semiconductor laser toward the substrate.

16. The method of claim 15, further comprising distributing the external force using a curved edge of the substrate mating surface.

17. The method of claim 14, further comprising:
   depositing solder on the contact surface of the semiconductor laser prior to arranging the semiconductor laser on the substrate, wherein:

arranging the semiconductor laser on the substrate includes electrically connecting the contact surface of the semiconductor laser to the contact pad of the substrate; and the solder is located between the contact surface and the contact pad.

18. The method of claim 17, wherein a surface tension of the solder draws the tapered laser mating surface into attachment with the tapered substrate mating surface.

19. A photonic integrated circuit (PIC) substrate, comprising:
   a recessed landing area formed in the substrate; and
   a waveguide formed in at least one material layer on the substrate and configured to receive an optical signal produced by a semiconductor laser, wherein:
   the at least one material layer comprises a tapered substrate mating surface;
   a shape of the tapered substrate mating surface corresponds to a shape of a tapered mating surface of the semiconductor laser to align the semiconductor laser with the substrate; and
   a front edge of the waveguide is completely positioned between where the tapered substrate mating surface is narrower and the tapered substrate mating surface is wider.

20. The PIC substrate of claim 19, wherein the waveguide includes an angled front edge.

21. The PIC substrate of claim 19, wherein the shape of the tapered substrate mating surface is configured to contact a first edge of the semiconductor laser and preserve a space between the tapered substrate mating surface and a second edge of the semiconductor laser.

22. The PIC substrate of claim 19, wherein the tapered substrate mating surface includes a curved edge configured to distribute an external force applied to the semiconductor laser during an alignment of the semiconductor laser with the substrate.

23. A semiconductor laser, comprising:
   an active region sandwiched between an upper cladding layer and a lower cladding layer;
   a laser mating surface comprising a tapered laser mating surface formed through etching and configured to align the semiconductor laser with a tapered substrate mating surface formed on a substrate, wherein a shape of the tapered laser mating surface corresponds to a shape of the tapered substrate mating surface; and
   an etched laser facet configured to exit a laser beam produced by the semiconductor laser for receipt by a waveguide formed on the substrate, the etched laser facet being completely set back to a position between where the tapered laser mating surface is narrower and the tapered laser mating surface is wider.

24. The semiconductor laser of claim 23, wherein a first edge of the tapered laser mating surface is configured to contact the tapered substrate mating surface when the semiconductor laser is aligned with the substrate.

25. The semiconductor laser of claim 24, wherein a back portion of the semiconductor laser is configured to contact a rear wall of the substrate when the semiconductor laser is aligned with the substrate.

26. The semiconductor laser of claim 25, wherein a side surface of the semiconductor laser is configured to contact a side wall of the substrate when the semiconductor laser is aligned with the substrate.

27. The semiconductor laser of claim 26, wherein a portion of the side surface of the semiconductor laser is configured to be located above a gap portion of the substrate when the semiconductor laser is aligned with the substrate.

28. The semiconductor laser of claim 27, wherein a second edge of the tapered laser mating surface is configured not to contact the tapered substrate mating surface.

29. The semiconductor laser of claim 23, further comprising:
   a contact surface configured to form an electrical connection with the substrate.

30. The semiconductor laser of claim 29, further comprising:
   a semiconductor contact layer above the upper cladding layer; and
   a metallic contact layer, wherein a surface of the metallic contact layer is the contact surface.

31. The semiconductor laser of claim 30, wherein the upper cladding layer is configured to keep optical loss due to the semiconductor contact layer and metallic contact layer less than 0.3/cm.

32. The semiconductor laser of claim 30, wherein the metallic contact layer comprises two electrodes.

33. The semiconductor laser of claim 32, wherein a first electrode of the two electrodes corresponds to a p-contact of the semiconductor laser and a second electrode of the two electrodes corresponds to an n-contact of the semiconductor laser.

* * * * *